(12) United States Patent
Kondo

(10) Patent No.: US 7,679,095 B2
(45) Date of Patent: Mar. 16, 2010

(54) OPTOELECTRIC COMPOSITE SUBSTRATE AND ELECTRONIC APPARATUS

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 209 days.

(21) Appl. No.: 11/675,378

(22) Filed: Feb. 15, 2007

(65) Prior Publication Data

US 2007/0194337 A1 Aug. 23, 2007

(30) Foreign Application Priority Data

Feb. 21, 2006 (JP) ............................. 2006-043481
Sep. 22, 2006 (JP) ............................. 2006-256861

(51) Int. Cl.
*H01L 33/00* (2006.01)
(52) U.S. Cl. ................. 257/98; 257/99; 257/E25.032
(58) Field of Classification Search .......... 257/98–100, 257/432, 433, 79, 82, 113, 114, E33.059, 257/E25.032

See application file for complete search history.

(56) References Cited

U.S. PATENT DOCUMENTS

| | | | | |
|---|---|---|---|---|
| 6,051,848 | A * | 4/2000 | Webb | ........................... 257/99 |
| 6,998,647 | B2 * | 2/2006 | Morimoto et al. | ............. 257/99 |
| 2005/0180681 | A1 * | 8/2005 | Umebayshi et al. | ........... 385/15 |
| 2006/0062269 | A1 * | 3/2006 | Shimonaka | .............. 372/43.01 |
| 2006/0102914 | A1 * | 5/2006 | Smits et al. | ................... 257/98 |

FOREIGN PATENT DOCUMENTS

| | | |
|---|---|---|
| JP | A 2000-101185 | 4/2000 |
| JP | A 2004-023058 | 1/2004 |
| JP | A 2004-273923 | 9/2004 |

OTHER PUBLICATIONS

Joerg Kuehnholz; "Micro/nano replication technique for optical and electric applications," New Technology Communications; vol. 27, No. 2; Feb. 2005; pp. 163-166. (with translation).

* cited by examiner

*Primary Examiner*—Sue Purvis
*Assistant Examiner*—Selim Ahmed
(74) *Attorney, Agent, or Firm*—Oliff & Berridge, PLC

(57) ABSTRACT

An optoelectric composite substrate includes a substrate, a light emitting element positioned on the substrate, and a lens mold positioned on the light emitting element and contacting at least a part of the substrate, wherein the lens mold includes a lens element, the lens element positions so as to overlap an emitting surface of the light emitting element, and a distance between the light emitting element and the lens element is greater than a range of a Fresnel region of the light emitting element.

21 Claims, 13 Drawing Sheets

OPTOELECTRIC COMPOSITE SUBSTRATE AND ELECTRONIC APPARATUS

BACKGROUND OF THE INVENTION

1. Technical Field

Several aspects of the present invention relate to an optoelectric composite substrate equipped with an electric wiring pattern and a photoelectric transducer, and an electronic apparatus equipped with the optoelectric composite substrate.

2. Related Art

In recent years, optical communications for performing transmission/reception of information using optical signals have been in heavy usage. The optical communications have advantages such as lower attenuation, increased amount of handling information, or prevention of electromagnetic irradiation to the environment in comparison with electrical communications for performing transmission/reception of information using electric signals. Although in the past the optical communications have been almost limited to middle/long distance communications of longer than about several hundreds of kilometers, in recent years they have been frequently used for short-range communications of about several kilometers, and further, they are becoming to be used for communications of information between electronic apparatuses with a distance of several meters or for communications of information inside an electronic apparatus.

In the above electronic apparatuses, there are provided optoelectric composite substrates each equipped with an electric wiring pattern for an electric signal and a photoelectric transducer in order to f convert the electric signal and an optical signal to each other. A document ("Micro/nano Copying Technology for Optical and Electrical Application" by Joerg Kuehnholz, O plus E, issued by New Technology Communications, February, 2005, pp 163-166) discloses a technology for forming a microlens for refracting a laser beam emitted from a vertical cavity surface emitting laser (VCSEL, surface emitting laser) as the photoelectric transducer on a surface of an optoelectric composite substrate provided with VCSEL and an electric wiring pattern connected to VCSEL.

Meanwhile, according to the above document, since a microlens is formed directly on gallium arsenide (GaAs) substrate provided with VCSEL, it is difficult to make the planar area of a molded section including a microlens greater than the planar area of VCSEL chip divided later. Further, an electrode (a pad) as an external connection terminal of VCSEL is formed on the surface of VCSEL chip, and the external connection terminal needs to be exposed. Therefore, there is a restriction that the molded section described above cannot be made larger than the area obtained by subtracting the planar area of the electrode from the planar area of VCSEL chip.

On the other hand, in order to fair a laser beam emitted from VCSEL with a microlens formed on the substrate, the portion where a microlens is formed needs to be distant from the emitting region of VCSEL to some extent. In other words, if the emitting region of VCSEL, can be regarded as an ideal point source of light, the distance between the emitting region and a microlens is irrelevant, but it is practically a surface light source having a diameter of about several μm in the active layer. Assuming here that the diameter of the emitting region is D and the wavelength is λ, it is known that geometrical-optical treatment of the laser beam emitted from the active layer is not allowed if the distance from the active layer is not greater than about $L=D^2/\lambda$. The area with a greater distance from the active layer than λ, is called the Fraunhofer region on the one hand, and the area with smaller distance than L is called the Fresnel region on the other hand. Although fairing of the laser beam by a lens or the like is possible in the Fraunhofer region, it is quite difficult in the Fresnel region to convert the laser beam into parallel light or to condense the laser beam. Therefore, there exists the restriction that the portion where a microlens is formed needs to be distant from the emitting region of VCSEL to some extent (in a range of about 100 through 200 μm).

Considering the two restrictions described above, if the planar area of VCSEL chip is about 500 μm square, it is quite difficult to provide the base area of the molded section forming a microlens sufficiently with respect to the height thereof as disclosed in the document mentioned above. Therefore, it is easily conceivable that damages such as breakage, slant, uncoupling, or bend of the molded section might be caused in a dicing process for clipping the discrete VCSEL, from the substrate, which causes degradation of production yield. Although enlargement of the base area (the contact area with the substrate) of the molded section is effective for preventing such damages, if the base area of the molded section is enlarged, the size of the discrete VCSEL chip becomes remarkably large to significantly reduce the number of VCSEL chips manufactured from one sheet of the substrate, thus causing an elevation of the production cost.

SUMMARY

In view of the above circumstances, an advantage of the invention is to provide an optoelectric composite substrate capable of preventing degradation of the production yield caused by damages of a molded section without causing an elevation of the production cost, and an electronic apparatus equipped with the optoelectric composite substrate.

According to an aspect of the invention, an optoelectric composite substrate includes a substrate; a light emitting element positioned on the substrate; and a lens mold positioned on the light emitting element and contacting at least a part of the substrate. The lens mold includes a lens element, the lens element positions so as to overlap an emitting surface of the light emitting element, and a distance between the light emitting element and the lens element is greater than a range of a Fresnel region of the light emitting element.

In the optoelectric composite substrate a distance between the light emitting element and the lens element is preferably within a range of a Fraunhofer region of the light emitting element. According to this aspect of the invention, in the case in which the surface of the lens mold is formed inside the Fraunhofer region, and the lens element is formed on the surface, the lens surface can be formed without causing elevation of the manufacturing cost.

In the optoelectric composite substrate assuming that a diameter of a near-field pattern of the light emitted by the light emitting element is D and a wavelength thereof is λ, a Fraunhofer region of the light emitted from the light emitting element is preferably an area with a greater distance from the light emitting element than the distance $L=D^2/\lambda$. It should be noted that the diameter D is a rough diameter of an area drawn by a plot satisfying maximum intensity of the intensity distribution of the near-field pattern multiplied by (1/e raised to the power 2).

In the optoelectric composite substrate, the light emitting element is a VCSEL, and the Fresnel region is preferably a distance between an active layer of VCSEL and the lens element.

In the optoelectric composite substrate, an electric circuit is disposed on the substrate, the electric circuit is electrically connected to the light emitting element via a wiring pattern, and a part of the electric circuit preferably contacts the lens mold.

In the optoelectric composite substrate, the lens mold is preferably made of resin.

In the optoelectric composite substrate, the lens mold preferably includes a coloring matter. According to this aspect of the invention, the transmission of the lens mold can be adjusted to, for example, weaken the light output from the light emitting element. In the case in which the light emitting element is a semiconductor laser and so on, it is possible that the light output exceeds the upper limit defined by the eye-safe standard in the high speed operations. Therefore, by controlling the transmission of the lens mold, both of the high-speed operation of the light emitting element and compliance to the eye-safe standard can be satisfied.

In the optoelectric composite substrate, an insulation film is preferably disposed between the light emitting element and the lens mold. According to this aspect of the invention, since the insulation film for covering at least the light emitting element and the periphery thereof is formed, the light emitting element becomes the condition sealed by the insulation film, thus the blocking performance from the outside is enhanced. Therefore, blocking performance against moisture is also improved, and the deterioration of the light emitting element caused by oxidation can be prevented, thus the reliability can be enhanced.

In the optoelectric composite substrate, an insulation film is disposed between the light emitting element and the lens mold, and the thickness of the insulation film is preferably one of a half as thick as the wavelength of the light emitted by the light emitting element and a quarter as thick as the wavelength of the light to be input to the light emitting element.

In the optoelectric composite substrate, the lens element is preferably formed inside the lens mold.

In the optoelectric composite substrate, the lens element is preferably a gradient-index lens based on gradient index formed inside the lens mold.

In the optoelectric composite substrate, the lens element is preferably one of a Fresnel lens provided to the surface of the lens mold, a diffraction grating, and a refracting lens.

According to another aspect of the invention, a optoelectric composite substrate includes: a substrate, a light receiving element positioned on the substrate, and a lens mold positioned on the light receiving element and contacting at least a part of the substrate. The lens mold includes a lens element, the lens element positions so as to overlap an receiving surface of the light receiving element, and the lens mold is made of resin, and the lens element can be formed one of on the surface of the lens mold and inside the lens mold.

According to another aspect of the invention, a optoelectric composite substrate includes a substrate, a light emitting element, a light receiving element positioned on the substrate, and a first electric circuit positioned on the substrate and electrically connected to the light emitting element via a first wiring pattern, a second electric circuit positioned on the substrate and electrically connected to the light receiving element via a second wiring pattern, a lens mold positioned on the light emitting element and the light receiving element and contacting at least a part of the substrate, at least a part of the first electric circuit, and at least a part of the second electric circuit. The lens mold includes a first lens element and a second lens element, the first lens element positions so as to overlap an emitting surface of the light emitting element, and the second lens element positions so as to overlap an receiving surface of the light receiving element. According to this aspect of the invention, since the light receiving section is provided to the circuit section, the area of the receiving surface can be enlarged.

Further, according to another aspect of the invention, an electronic apparatus includes the optoelectric composite substrate described above. According to this aspect of the invention, since the optoelectric composite substrate is provided, the communication capacity can be increased, and electromagnetic irradiation to the environment can be prevented.

Further, according to another aspect of the invention, a method of manufacturing an optoelectric composite substrate includes; forming on a substrate an optical element, and an electric circuit electrically connected to the optical element; coating the optical element and the electric circuit with a light curing resin; disposing a mask on the light curing resin, the mask including a light blocking section and a light transmission section on which an optical element pattern is formed; irradiating the mask with light to cure a part of the light curing resin, thus forming the optical element in a section contacting the optical element pattern. According to this aspect of the invention, for example, individual optical components and the trouble of assembling and adjusting the individual optical components can be eliminated, thus dramatic reduction of cost can be expected.

Further, according to another aspect of the invention, in an optoelectric composite substrate, the electric wiring pattern has substantially the same thickness as the thickness of the low-profile optical element at least a portion adjacent to the low-profile optical element, and the electric wiring pattern and the low-profile optical element are connected to each other with a metal wiring pattern.

According to this aspect of invention, the low-profile optical element and the electric wiring pattern are formed so as to have substantially the same thickness in the portion of the electric wiring pattern adjacent to the low-profile optical element, and the height position of the front face of the low-profile optical element and the height position of the upper surface of the electric wiring pattern can be substantially the same, therefore, connection with the metal wiring pattern is not hindered by the step, thus the electric wiring pattern and the low-profile optical element can easily be connected to each other. Further, since the step between the low-profile optical element and the printed wiring pattern is very small, a transparent member can also be formed without any problems. It should be noted here that the metal wiring pattern is preferably either one of a metallic ink wiring pattern, a metallic paste wiring pattern, a metallic coating wiring pattern, and a metallic sputter wiring pattern. In particular, formation of the metal wiring pattern with the metallic ink wiring pattern allows the connection with high productivity and low cost.

Further, in the optoelectric composite substrate according to another aspect of the invention, it is preferable that a circuit section and the external electrode for the circuit section of the electric circuit relating to the light emitting element are formed on the side of the front face of the substrate, and the lens mold is formed so as to leave the upside of the external electrode open and cover the top of the circuit section.

According to this aspect of the invention, since the electric circuit relating to the light emitting element is formed on the side of the front face of the substrate, it is possible to realize a microminiature optical communication module having the light emitting element, the electric circuit relating to the light emitting element, and a lens surface for refracting the light input/output by the light emitting element integrated therein. It should be noted here that although the top of the circuit section of the electric circuit is covered by the transparent member, the upside of the external terminal of the electric circuit is kept open without being covered by the transparent member, therefore, no problem at all will be caused in the electrical connection with an external circuit.

Further, it is preferable that the circuit section is provided with a detection section for detecting the light emitted from the light emitting element and a control section for controlling the light output of the light emitting element in accordance with the detection result of the detection section.

According to this aspect of the invention, the light emitted from the light emitting element as the low-profile optical element is detected by the detection section, and the light output of the light emitting element is controlled in accordance with the detection result. In other words, the automatic power control (APC), in which the light output of the light emitting element is fed-back to control the light output of the light emitting element, is realized. Therefore, even if environmental variation such as temperature variation occurs, the light output of the light emitting element can be controlled to be constant. It should be noted here that in the case in which the low-profile optical element can emit light not only from the front face but also from the rear face, it is preferable to detect the light emitted from the rear face towards the side of the substrate by the detection section.

Further, it is preferable that the circuit section of the electric circuit is provided with an amplifying circuit for the electric signal photo-electrically converted by the light receiving element.

According to this aspect of the invention, since the amplifying circuit for the electric signal photo-electrically converted by the light receiving element is formed, a light receiving module having the light receiving element, the amplifying circuit of the light receiving element, and the light condensing element integrated therein can be realized.

Further, it is also possible that the light emitting element and the light receiving element are mounted on the substrate, the circuit section of the electric circuit is provided with a drive circuit for driving the light emitting element and an amplifying circuit for the electric signal photo-electrically converted by the light receiving section.

According to this aspect of the invention, it is possible to realize a microminiature optical communication module having the light emitting element, the light receiving element, the drive circuit of the light emitting element, the amplifying circuit of the light receiving element, and the surface of the lens for refracting the light input/output by the low-profile optical element integrated with each other.

Further, it is preferable that the circuit section is provided with a detection section for detecting the light emitted from the light emitting element and a control section for controlling the light output of the light emitting element in accordance with the detection result of the detection section.

According to this aspect of the invention, the light emitted from the light emitting element is detected by the detection section, and the light output of the light emitting element is controlled in accordance with the detection result. Therefore, the automatic power control (APC) for controlling the light output of the light emitting element is realized, even it environmental variation such as temperature variation occurs, the light output of the light emitting element can be controlled to be constant. It should be noted here that in the case in which the light emitting element can emit light not only from the front face but also from the rear face, it is preferable to detect the light emitted from the rear face towards the side of the substrate by the detection section.

Further, in the optoelectric composite substrate according to an aspect of the invention, the transmission of the lens mold to the light emitted from the light emitting element can be equal to or lower than 50 percent.

BRIEF DESCRIPTION OF THE DRAWINGS

The invention will now be described with reference to the accompanying drawings, wherein like numbers refer to like elements.

DESCRIPTION OF EXEMPLARY EMBODIMENTS

Figure 1:
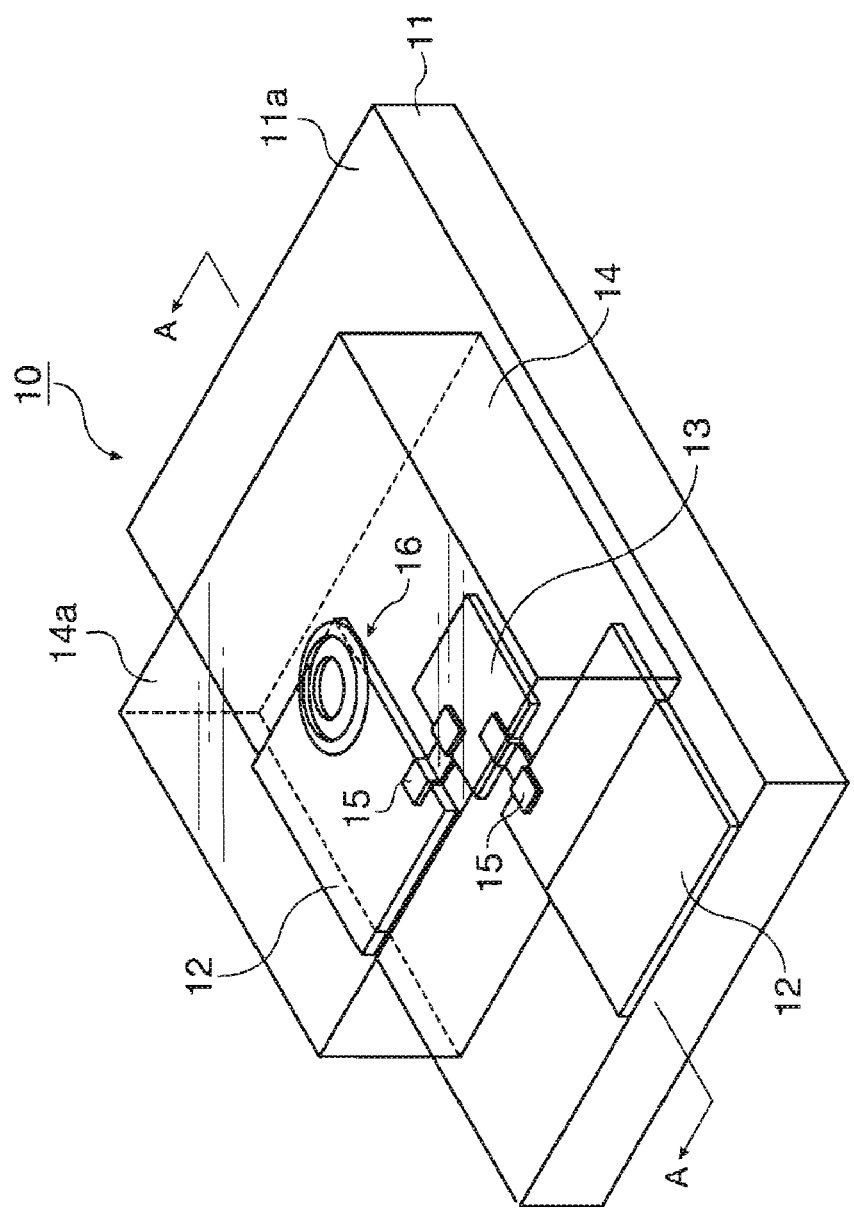
FIG. 1 is a perspective view showing a substantial part of an optoelectric composite substrate according to a first embodiment of the invention.

Hereinafter, an optoelectric composite substrate and an electronic apparatus according to an embodiment of the invention will be described in detail with reference to the accompanying drawings. It should be noted that the embodiments described hereinafter show only some aspects of the invention, but do not limit the scope of the invention, and can arbitrarily be modified within the scope of the invention. Further, in the drawings referred to in the description below, the scale ratios of the various layers and the various members may be set differently in order for illustrating the various layers and the various members in visible sizes on the drawings.

First Embodiment

Figure 2:
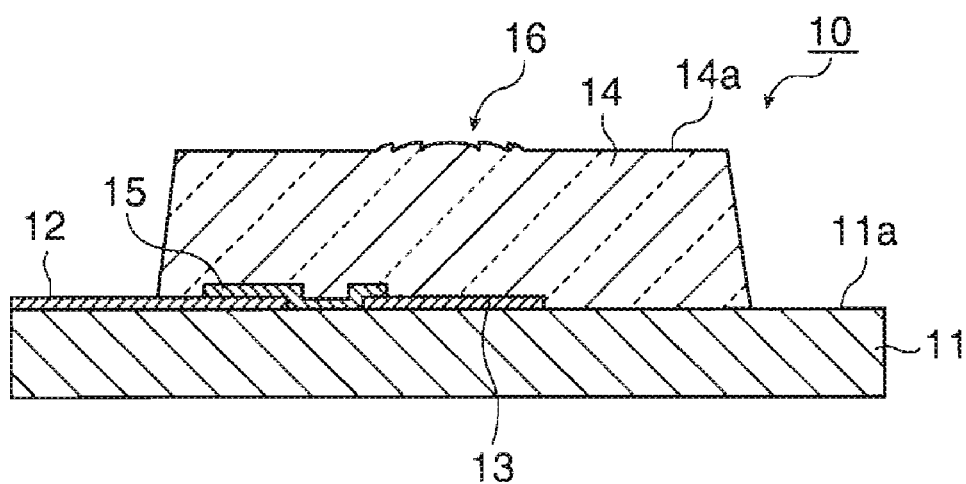
FIG. 2 is a cross-sectional view along the A-A line shown in FIG. 1.

FIG. 1 is a perspective view showing a substantial part of an optoelectric composite substrate 10 according to a first embodiment of the invention, and FIG. 2 is a cross-sectional view along the A-A line shown in FIG. 1. As shown in FIGS. 1 and 2, the optoelectric composite substrate 10 is configured including a substrate 11, a printed wiring pattern 12 formed on a side of the front face 11a of the substrate 11, a low-profile optical element 13 mounted on the side of the front face 11a of the substrate 11, and a lens mold 14 formed on the side of the front face 11a of the substrate 11 so as to cover the top of the low-profile optical element 13. It should be noted that although in the present embodiment, the case in which the optoelectric composite substrate 10 is a printed wiring board with very little flexibility is explained as an example, it can be a flexible printed wiring board (FPC) with much flexibility.

As the substrate 11, a substrate made at least of, for example, phenol resin or glass epoxy resin, ceramics, glass, plastic, or semiconductor substrate such as silicon substrate can be used. Since the substrate 11 is required to have a large area for ensuring the planar area of the lens mold 14 (as described in detail below), a low-cost material is preferably used therefor. It should be noted that although the case in which the substrate 11 has very little flexibility is explained in the present embodiment, the substrate with substantial flexibility can also be used. As the substrate with substantial flexibility, for example, a substrate composed at least of a polyimide film, which excels in insulation performance and heat resistance and has substantial flexibility, can be used.

The printed wiring pattern 12 is formed on the side of the front face 11a of the substrate 11 along the front face 11a, and is electrically connected to the low-profile optical element 13. The printed wiring pattern 12 is formed to have substantially the same thickness as the thickness of the low-profile optical element 13 at least in a part contacting the low-profile optical element 13, and the thickness of this part is, for example, equal to or smaller than 5 μm. In this case, if the thickness of the whole printed wiring pattern 12 on the substrate 11 is made smaller than about 5 μm, a possibility of breakage of the printed wiring pattern 12 is conceivable. Therefore, it is preferable that only the part contacting the low-profile optical element 13 is formed to have the thickness of about 5 μm while the thickness of the rest is set substantially the same as the thickness of a wiring pattern formed on an usual substrate of about 30 through 70 μm.

It should be noted that although an example in which two printed wiring patterns 12 are connected to the low-profile optical element 13 is illustrated in FIG. 1, the number of the printed wiring patterns 12 connected to the low-profile optical element 13 is not limited thereto, but can arbitrarily be set in accordance with the number of electrodes (not shown formed on the front face of the low-profile optical element 13. Further the layout of the printed wiring patterns 12 with respect to the low-profile optical element 13 is also arbitrary, and any layouts can be adopted.

The low-profile optical element 13 is a photoelectric transducer for converting an electric signal into an optical signal or an optical signal into an electric signal. The low-profile optical element 13 is an optical element having, for example, the area smaller than several hundreds μm square and a thickness equal to or smaller than 10 μm, provided with an electrode (not shown) formed on the front face, and capable of at least either outputting or inputting light through at least the front face. It should be noted that the light input and the light output from the surface of the low-profile optical element 13 are collectively denoted as light input/output. The light input/output denotes the case only with light input, the case only with light output, and the case with both light output and light input. Further, the front face of the low-profile optical element 13 denotes a surface set upward when the low-profile optical element 13 is mounted on the substrate 11, and the rear face of the low-profile optical element 13 denotes a surface set downward (towards the substrate 11) when the low-profile optical element 13 is mounted on the substrate 11.

The low-profile optical element 13 is mounted on the substrate 11 with the rear face adhering to the front face of the substrate 11. It should be noted that "adherence" between the rear face of the low-profile optical element 13 and the front face 11a of the substrate 11 includes both of a condition in which the rear face of the low-profile optical element 13 and the front face 11a of the substrate 11 come into direct contact with each other, and a condition in which the rear face of the low-profile optical element 13 and the front face 11a of the substrate 11 face each other via an adhesive or the like with a slight thickness. The low-profile optical element 13 is manufactured using a so-called epitaxial lift-off (ELO) method in which a sacrifice layer is formed on, for example, a semiconductor substrate a region having a photoelectric conversion function is formed on the upper part thereof, and then the region having the photoelectric conversion function is separated from the semiconductor substrate by etching the sacrifice layer. It should be noted that the manufacturing method of the low-profile optical element 13 will be described in detail later.

The low-profile optical element 13 is, for example, a light emitting element such as a light emitting diode (LED) or a vertical cavity surface emitting laser (VCSEL, a surface emitting laser), or a light receiving element such as a photo diode (PD). As a light emitting element, an LED has the simplest structure and is easy to manufacture, but has an optical signal modulation rate as low as several hundred Mbps. In contrast, a VCSEL can perform the modulation in an extremely high rate of over 10 Gbps, and in addition, it can be driven with low power consumption because of its low threshold current and high emission efficiency. It should be noted that as the light receiving element, for example, a silicon photo diode and a silicon photo transistor can be cited.

As described above, the printed wiring patterns 12 are electrically connected to the low-profile optical element 13. Specifically, they are connected by forming a metal wiring pattern 15 on the upper surfaces of the end portions of the printed wiring patterns 12, on the electrode formed on the upper surface of the low-profile optical element 13, and between the end portions of the printed wiring patterns 12 and the electrode formed on the upper surface of the low-profile optical element 13. It should be noted here that the metal wiring pattern 15 is preferably either one of a metallic ink wiring pattern, a metallic paste wiring pattern, a metallic coating wiring pattern, and a metallic sputter wiring pattern, for example. In particular, formation of the metal wiring pattern 15 with the metallic ink wiring pattern allows the connection with high productivity and low cost. It should be noted that if there is a large difference in the thickness between the low-profile optical element 13 and the printed wiring patterns 12, it becomes difficult to connect the electrodes formed on the front face of the low-profile optical element 13 to the printed wiring patterns 12. Therefore, the printed wiring patterns 12 are formed to have the thickness substantially the same as the thickness of the low-profile optical element 13 at least in the end portions (the portions adjacent to the low-profile optical element 13), thereby making it easy to connect the low-profile optical element 13 and the printed wiring patterns 12 with the metal wiring patterns 15.

The lens mold 14 is formed on the side of the front face 11a of the substrate 11 so as to cover the low-profile optical element 13, the metal wiring patterns 15, and the end portions of the printed wiring patterns 12. The lens mold 14 is provided with a lens element 16 formed thereon for refracting the light input/output by the low-profile optical element 13. It should be noted that in the example shown in FIGS. 1 and 2, the forming position of the lens element 16 is a position of the front face 14a above the low-profile optical element 13. The height position of the front face 14a of the lens mold 14, namely the height position where the lens element 16 is formed is arranged to be within the Fraunhofer region where geometrical-optical treatment of the light input/output by the low-profile optical element 13 is possible.

In this case, if the low-profile optical element 13 is a VCSEL, the emitting region of the low-profile optical element 13 cannot be regarded as an ideal point source of light because it has a diameter of about several μm. Therefore, the Fresnel region, in which the geometrical-optical treatment of the light input/output by the low-profile optical element is not allowed, is created within a certain distance from the low-profile optical element 13, and if the lens element 16 is disposed inside the Fresnel region, it becomes quite difficult, for example, to condense the light input/output by the low-profile optical element 13. Therefore, in the present embodiment, the height position of the front face 14a of the lens mold 14, namely the height position where the lens element 16 is formed is arranged within the Fraunhofer region.

Specifically, assuming that the diameter of the emitting region in the active layer of the low-profile optical element 13 is D and the wavelength of the light emitted from the low-profile optical element 13 is λ, the height position of the front face 14a (the lens element 16) of the lens mold 14 is arranged to be the position with at least the distance $L=D^2/\lambda$ from the active layer of the low-profile optical element 13. More specifically, since the diameter D of the emitting region in the active layer of VCSEL is typically about several μm, the height position of the front face 14a (the lens element 16) of the lens mold 14 is arranged to be the position equal to or greater than 100 through 200 μm distant from the active layer of the low-profile optical element 13.

As described above, although the height position of the front face 14a of the lens mold 14 is arranged to be the position equal to or greater than 100 through 200 μm distant from the active layer of the low-profile optical element 13, the planar area thereof is arbitrarily set in accordance with the height position of the front face 14a of the lens mold 14. As described above, if the planar area is too small in comparison with the height of the lens mold 14, damages such as breakage, slant, uncoupling, or bend of the lens mold 14 might be caused in a dicing process for clipping the discrete optoelectric composite substrates 10 from the substrate 11, which might cause degradation of production yield. Therefore, the planar area of the lens mold 14 is preferably enlarged to the extent sufficient to prevent such damages. For example, in the case in which the height position of the front face 14a of the lens mold 14 is about 100 μm, the area of about several mm through several tens mm square or more is preferable. As described above, if the low cost material is used for the substrate 11, the cost is not so much increased even if the area of the substrate 11 is enlarged. It should be noted that although the case in which the planar shape of the lens mold 14 is rectangular is exemplified in FIG. 1, it is obvious that the planar shape can be any shapes such as a circular shape.

The lens element 16 is an optical element for refracting the light input/output by the low-profile optical element 13, and the Fresnel lens shown in FIGS. 1 and 2, a diffraction grating for diffracting to condense the light input/output by the low-profile optical element 13, or a refracting lens applying the refraction of light can be used therefor. It should be noted that although the case in which the lens element 16 is formed on the front face 14a of the lens mold 14 is explained as an example in FIGS. 1 and 2; the lens element 16 can be formed inside the lens mold 14. For example, it can be a gradient-index lens formed by diffusing ions or the like inside the lens mold 14 to form gradient index in the lens mold 14. It should be noted that even in the case in which the lens element 16 is formed inside the lens mold 14, the lens element 16 needs to be formed within the Fraunhofer region. Therefore, if the lens 16 is formed inside the lens mold 14, the lens mold 14 needs to be formed so that the position of the front face 14a becomes higher than in the case in which the lens element 16 is formed on the front face 14a.

The lens mold 14 is a transparent member, and is formed of a material transmitting the light input/output by the low-profile optical element 13. For example, a photosensitive sol-gel material or light-curing resin such as ultraviolet curing resin can preferably be used. In this case, in order for reducing absorption by the lens mold 14 as much as possible the higher transmission of the lens mold 14 is more preferable. However, if the low-profile optical element 13 is a VCSEL or the like, for example, there might be the case in which the light output exceeds the upper limit defined in the eye-safe standard in the high-speed operation. In such a case, it is preferable to add a coloring matter (a coloring agent) such as dye or pigment to the lens mold 14 to lower the transmission thereof to equal to or smaller than 50%. By controlling the transmission of the lens mold 14, both of the high-speed operation of the low-profile optical element 13 and compliance to the eye-safe standard can be satisfied.

In the above configuration, if the low-profile optical element 13 is a light emitting element, when the electric signal is transmitted via the printed wiring pattern 12, the electric signal is then input to the low-profile optical element 13 via the metal wiring pattern 15. The electric signal is then converted into an optical signal by the low-profile optical element 13, and the optical signal is output from the front face of the low-profile optical element 13. It should be noted that it is possible that the optical signal is output from both of the front face and the rear face of the low-profile optical element 13 in accordance with the type of the low-profile optical element 13. The optical signal output from the front face of the low-profile optical element 13 is transmitted through the inside of the lens mold 14 to enter the lens element 16, refracted by the lens element 16 to be converted into, for example, parallel light, and emitted to the outside.

On the other hand, if the low-profile optical element 13 is a light receiving element, when an optical signal from the outside enters the lens element 16, the optical signal is condensed by the lens element 16, transmitted through the inside of the lens mold 14, input to the inside of the low-profile optical element 13 from the front face of the low-profile optical element 13, and converted into the electric signal by the low-profile optical element 13. The electric signal converted by the low-profile optical element 13 is output to the printed wiring pattern 12 from the electrode not shown formed on the front face of the low-profile optical element 13, and is transmitted through the printed wiring pattern 12.

As explained hereinabove, according to the present embodiment, the low-profile optical element 13 capable of inputting/outputting light at least through the front surface is mounted on the substrate 11 so that the rear surface thereof adheres to the front face 11a of the substrate 11, and the lens mold 14 provided with the lens element 16 for refracting the light input/output by the low-profile optical element 13 formed within the Fraunhofer region of the light input/output by the low-profile optical element 13 so as to cover at least the low-profile optical element 13 and a part of the printed wiring pattern 12. Therefore, by enlarging the area of the low-cost substrate 11, the size (the chip size) of the optoelectric composite substrate 10 can be enlarged without causing an elevation of the cost thereof. In other words, it is not required to grow the expensive substrate itself for forming the low-profile optical element 13 in size.

Therefore, the base area of the lens mold 14 can be enlarged as required without causing an elevation of cost to prevent degradation of the production yield caused by damages such as breakage, slant, uncoupling, or bend of the lens mold 14. Further, since the geometrical-optical treatment of the light input/output by the low-profile optical element 13 becomes possible by forming the lens element 16 in the Fraunhofer region, fairing of the light becomes easy. If, for example, the low-profile optical element 13 is a light emitting element such as a VCSEL, the light output from the low-profile optical element 13 can easily be converted into parallel light.

Further, in the present embodiment, the thickness of the low-profile optical element 13 and the thickness of the printed wiring pattern 12 in the portion adjacent to the low-profile optical element 13 are made substantially identical to each other, thus the height position of the front face of the low-profile optical element 13 provided with the electrode formed thereon and the height position of the upper surface of the printed wiring pattern 12 can be set substantially the same. Therefore, the connection using the printed wiring pattern 12 is not hindered by the step, and the printed wiring pattern 12 and the low-profile optical element 13 can easily be connected to each other. Further, since the step between the low-profile optical element 13 and the printed wiring pattern is very small, the lens mold can also be formed without any problems.

Figure 3:
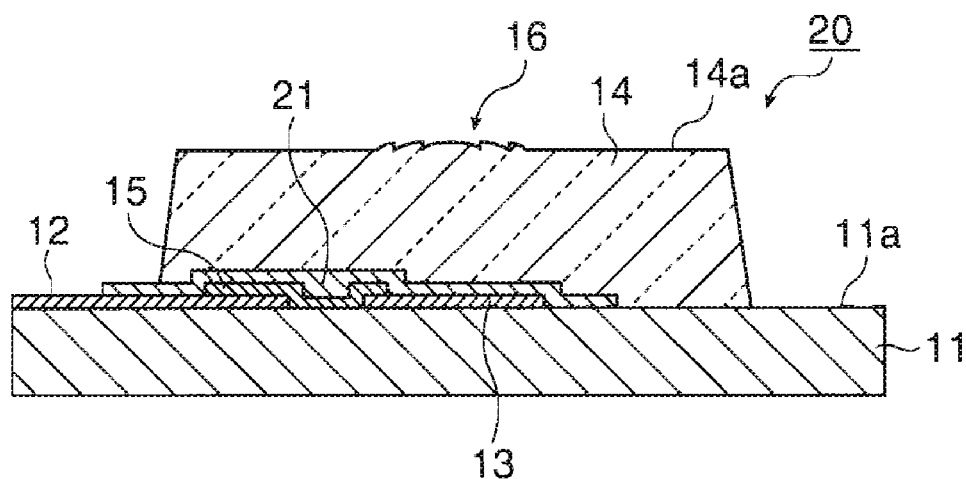
FIG. 3 is a cross-sectional view showing a modified example of the optoelectric composite substrate according to the first embodiment of the invention.

A modified example of the optoelectric composite substrate according to the first embodiment of the invention will hereinafter be described, FIG. 3 is a cross-sectional view showing a modified example of the optoelectric composite substrate according to the first embodiment of the invention. It should be noted that FIG. 3 is a cross-sectional view corresponding to the cross-sectional view along the A-A line shown in FIG. 1, and the components corresponding to the components provided to the optoelectric composite substrate 10 according to the first embodiment explained using FIGS. 1 and 2 are denoted with the same reference numerals. The point in which an optoelectric composite substrate 20 of the present modified example differs from the optoelectric composite substrate 10 shown in FIGS. 1 and 2 is that an insulation film 91 covering the low-profile optical element 13, the metal wiring pattern 15, and a part (an end portion) of the printed wiring pattern 12 is formed.

The insulation film 21 is provided for blocking the low-profile optical element 13 from the outside, and blocking moisture vapor to prevent deterioration of the low-profile optical element 13 caused by oxidation and so on. The insulation film 21 is an inorganic thin film such as SiN (silicon nitride). Assuming that the wavelength of the light input/output by the low-profile optical element 13 is $\lambda$ and the refractive index of the insulation film 21 is n, the thickness d of the insulation film 21 is set $d=\lambda/(2n)$ or $d=\lambda/(4n)$. If, for example, the low-profile optical element 13 is a light emitting element such as a VCSEL, the deterioration of the threshold and so on can be prevented by setting the thickness of the insulation film 21 to $d=\lambda/(2n)$ to enhance the reflectance of the resonator provided to VCSEL. Further, if the low-profile optical element 13 is a light receiving element such as a PD, reflection on the front surface of the low-profile optical element 13 can be reduced, thus enhancement of the light receiving efficiency can be intended.

It should be noted that although the optoelectric composite substrate 20 shown in FIG. 3 has a configuration in which only the upper surface of the low-profile optical element 13 is covered by the insulation film made at least of SiN and so on, a configuration in which the insulation film made at least of SiN and so on is formed on the front face 11a of the substrate 11 and the rear face of the low-profile optical element 13 is also covered by the insulation film can also be adopted. Thus, since the low-profile optical element 13 is in a condition sealed in the six directions by the insulation film formed on the side of the rear face and the insulation film 21 covering the low-profile optical element 13, the moisture blocking effect, which is not sufficient only by the substrate 11, can be enhanced.

Second Embodiment

Figure 4:
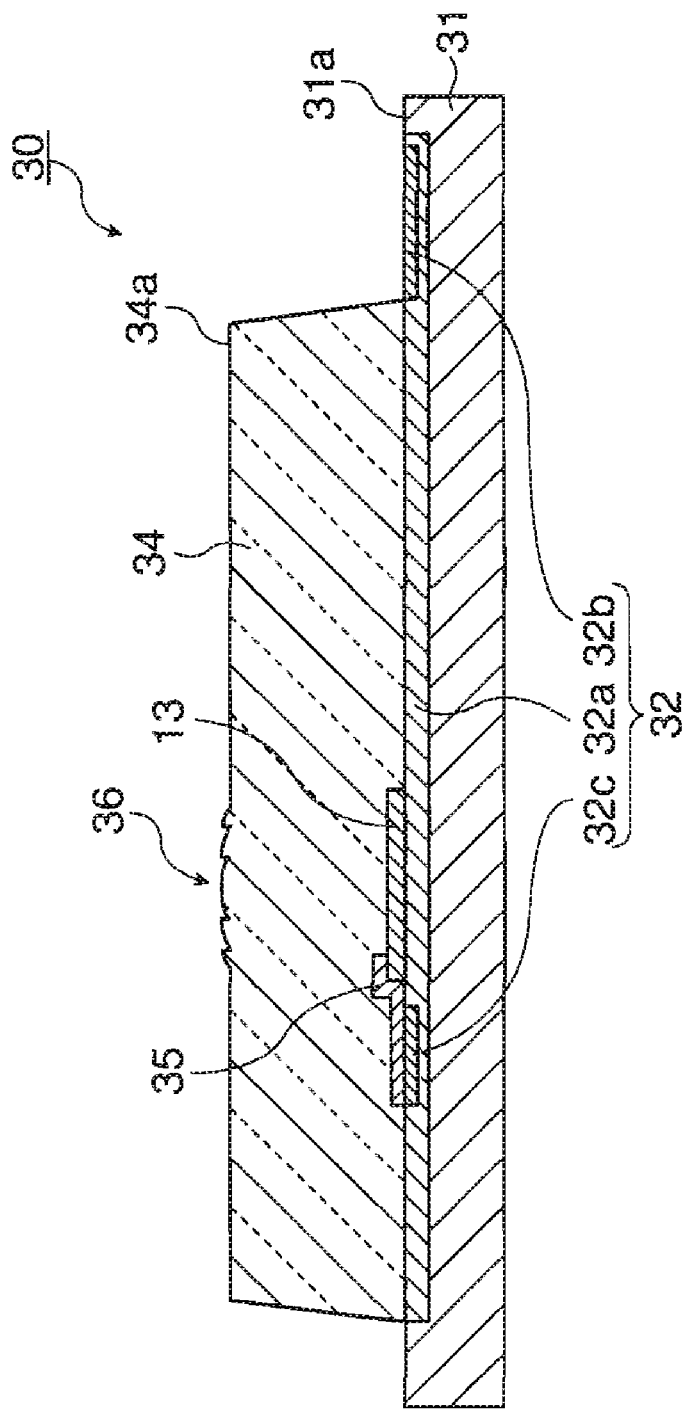
FIG. 4 is a cross-sectional view showing a substantial part of an optoelectric composite substrate according to a second embodiment of the invention.

FIG. 4 is a cross-sectional view showing a substantial part of the optoelectric composite substrate according to a second embodiment of the invention. It should be noted that the components corresponding to the components provided to the optoelectric composite substrate 10 according to the first embodiment explained using the FIGS. 1 and 2 are denoted with the same reference numerals. As shown in FIG. 4, an optoelectric composite substrate 30 is configured including a substrate 31, the low-profile optical element 13 mounted on the side of the front face 31a of the substrate 31, and a lens mold 34 formed on the side of the front face 31a of the substrate 31 so as to cover the top of the low-profile optical element 13. It should be noted that although wiring patterns corresponding to the printed wiring patterns 12 provided to the optoelectric composite substrate 10 shown in FIGS. 1 and 2 are not illustrated in the example shown in FIG. 4, these wiring patterns can be formed on the side of the front face 31a of the substrate 31.

The substrate 31 is, for example, a semiconductor substrate such as a silicon substrate, and is provided with an electric circuit 32 relating to the low-profile optical element 13 formed on the side of the front face 31a thereof. The electric circuit 32 is composed at least of a circuit section 32a provided with a electronic component such as a transistor, an electrode pad 32b as an external electrode, and an electrode 32c electrically connected to the circuit section 32a. The circuit section 32a of the electric circuit 32 is provided with, for example, a drive circuit for driving the low-profile optical element 13 if the low-profile optical element 13 is a light emitting element such as a VCSEL, or provided with an amplifier circuit (amplifying circuit) for amplifying an electric signal photoelectrically converted by the low-profile optical element 13 if the low-profile optical element 13 is a light receiving element such as a PD.

A metal wiring pattern 35 is formed on the upper surface of the electrode 32c electrically connected to the circuit section 32a, on the electrode formed on the upper surface of the low-profile optical element 13, and between these electrodes, thus the circuit section 32a of the electric circuit 32 and the low-profile optical element 13 are electrically connected to each other. It should be noted here that the metal wiring pattern 35 is preferably either one of a metallic ink wiring pattern, a metallic paste wiring pattern, a metallic coating wiring pattern, and a metallic sputter wiring pattern, for example. In particular, formation of the metal wiring pattern 35 with the metallic ink wiring pattern allows the connection with high productivity and low cost. As shown in FIG. 4, since the electrode 32c is formed so as not to protrude upward from the front face 31a of the substrate 31, the step with the low-profile optical element 13 is low, thus the electrode 32c and the low-profile optical element 13 can easily be connected to each other with the metal wiring pattern 35.

The lens mold 34 is formed to cover the low-profile optical element 13 and the metal wiring pattern 35, and also to cover almost entire surface of the electric circuit 32 formed on the substrate 11. It should be noted that as shown in FIG. 4, it is not formed on the electrode pad 32b of the electric circuit 32, thus the upside of the electrode pad 32b remains open. Therefore, no problems occur in the electrical connection between the circuit section 32a provided to the electric circuit 32 and an external circuit (e.g., a power supply circuit). In this case, since the lens mold 34 is not formed on the electrode pad 32b, it is preferable to form the electrode pad 32b at a position with an enough distance from the low-profile optical element 13 for ensuring the necessary base area for the lens mold 34.

The lens mold 34 is provided with a lens element 36 formed thereon for refracting the light input/output by the low-profile optical element 13. It should be noted that although the forming position of the lens element 36 is the position of the front face 34a above the low-profile optical element 13 in the example shown in FIG. 4, the lens element 36 can also be formed inside the lens mold 34. It should also be noted that similarly to the case with the first embodiment, the height position where the lens element 36 is formed needs to be set within the Fraunhofer region where the geometrical-optical treatment of the light input/output by the low-profile optical element 13 is possible. Specifically, the height position where the lens element 36 is formed is required to set to a position (e.g., a position more than 100 through 200 μm distant from the active layer of the low-profile optical element 13) with at least a distance $L=D^2/\lambda$ from the active layer of the low-profile optical element 13.

It should be noted that if the lens element 36 is formed on the front face 34a of the lens mold 34, for example, the Fresnel lens shown in FIGS. 1 and 2, a diffraction grating for diffracting to condense the light input/output by the low-profile optical element 13, or a refracting lens applying the refraction of light can be used therefor. Further, if the lens element 36 is formed inside the lens mold 34, for example, a gradient-index lens formed by diffusing ions or the like inside the lens mold 34 to form gradient index in the lens mold 34 can be used. Further, similarly to the case with the first embodiment, it is possible to add a coloring matter (a coloring agent) such as dye or pigment to the lens mold 34 to lower the transmission thereof to equal to or smaller than 50%.

As described above, according to the present embodiment, since the electric circuit 32 relating to the low-profile optical element 13 is formed on the side of the front face 11a of the substrate 11, a microminiature optical communication module having the low-profile optical element 13, the electric circuit relating to the low-profile optical element 13, and the lens element 36 for refracting the light input/output by the low-profile optical element 13 integrated with each other can be realized. In this case, although the circuit section 32a of the electric circuit 32 is covered by the lens mold 34, no problems arise in the electrical connection with the external circuit such as the external power supply because the upside of the electrode pad 32b as the external electrode of the electric circuit 32 is not covered with the lens mold 34 and remains open. Further, by disposing the electrode pad 32b as the external electrode of the electric circuit 32 distant from the low-profile optical element 13, degradation of the production yield caused by damages such as breakage, slant, uncoupling, or bend of the lens mold 34 can be prevented.

Third Embodiment

Figure 5:
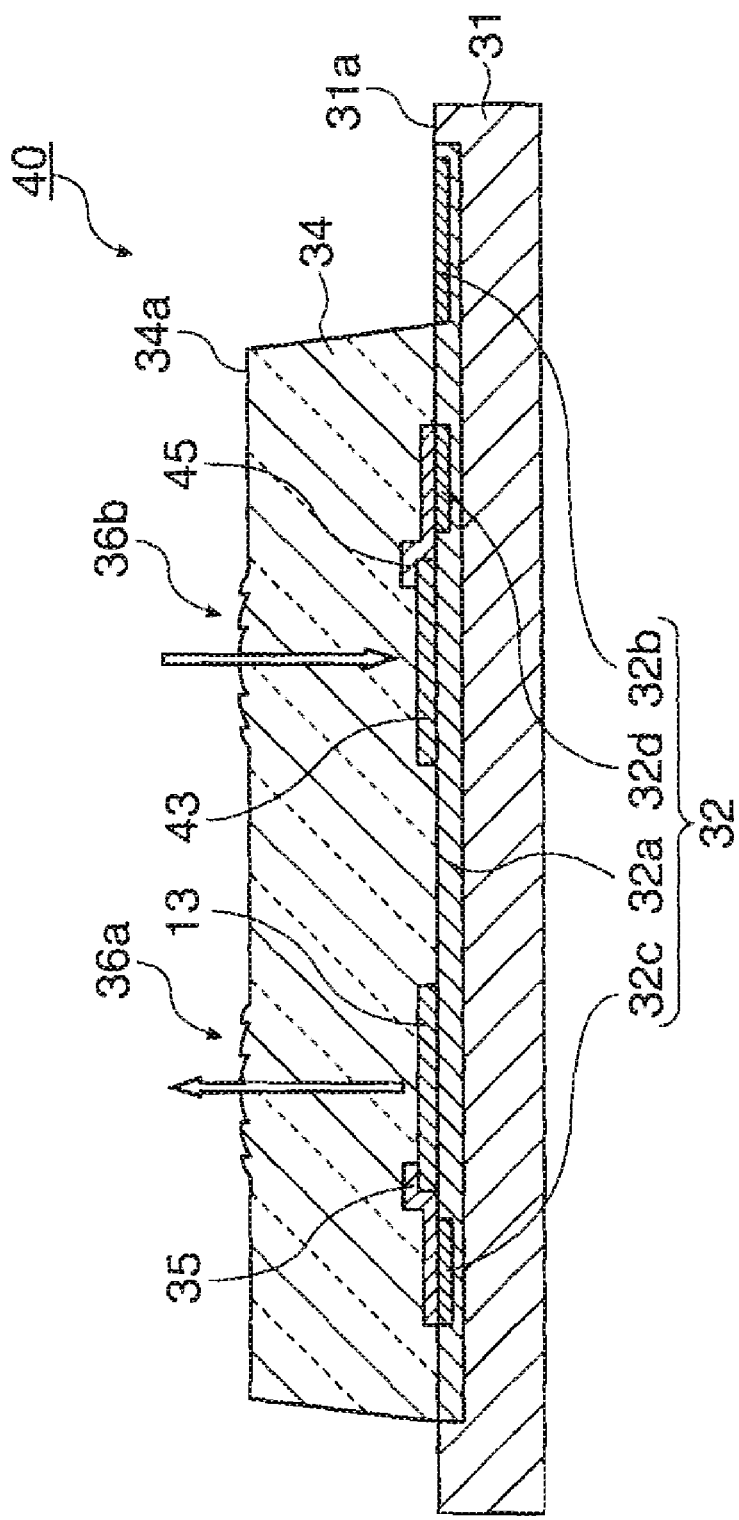
FIG. 5 is a cross-sectional view showing a substantial part of an optoelectric composite substrate according to a third embodiment of the invention.

FIG. 5 is a cross-sectional view showing a substantial part of the optoelectric composite substrate according to a third embodiment of the invention. It should be noted that the components corresponding to the components provided to the optoelectric composite substrate 30 according to the second embodiment explained using the FIG. 4 are denoted with the same reference numerals. Comparing an optoelectric composite substrate 40 of the present embodiment shown in FIG. 5 with the optoelectric composite substrate 30 of the second embodiment shown in FIG. 4, they are different from each other in that a new low-profile optical element 43 is mounted on the front face 31a of the substrate 31, and the lens elements 36a, 36b are formed on the front face 34a of the lens mold 34 respectively corresponding to the low-profile optical elements 13, 43. It should be noted that in the present embodiment, it is assumed that the low-profile optical element 13 is a light emitting element such as a VCSEL, and the low-profile optical element 43 is a light receiving element such as a PD.

In the electric circuit 32 formed on the side of the front face 31a of the substrate 31, there is formed an electrode 32d electrically connected to the circuit section 32a in addition to the circuit section 32a, the electrode pad 32b as the external electrode, and the electrode 32c. In the circuit section 32a of the electric circuit 32, there are formed a drive circuit for driving the low-profile optical element 13 as the light emitting element and an amplifier circuit (amplifying circuit) for amplifying the electric signal photoelectrically converted by the low-profile optical element 43 as the light receiving element.

A metal wiring pattern 45 is formed on the upper surface of the electrode 32d electrically connected to the circuit section 32a, on the electrode formed on the upper surface of the low-profile optical element 43, and between these electrodes, thus the circuit section 32a of the electric circuit 32 and the low-profile optical element 43 are electrically connected to each other. It should be noted here that the metal wiring pattern 45 is preferably either one of a metallic ink wiring pattern, a metallic paste wiring pattern, a metallic coating wiring pattern, and a metallic sputter wiring pattern, for example. In particular, formation of the metal wiring pattern 45 with the metallic ink wiring pattern allows the connection with high productivity and low cost. As shown in FIG. 5, since the electrode 32d is also formed so as not to protrude upward from the front face 31a of the substrate 31 similarly to the electrode 32c, the step with the low-profile optical element 43 is low, thus the electrode 32d and the low-profile optical element 43 can easily be connected to each other with the metal wiring pattern 45.

The lens mold 34 is formed to cover the low-profile optical elements 13, 43 and the metal wiring patterns 35, 45, and also to cover almost entire surface of the electric circuit 32 formed on the substrate 31. It should be noted that similarly to the second embodiment, it is not formed on the electrode pad 32b of the electric circuit 32, thus the upside of the electrode pad 32b remains open. Therefore, no problems occur in the electrical connection between the circuit section 32a provided to the electric circuit 32 and an external circuit (e.g., a power supply circuit). Further, since the lens mold 34 is not formed on the electrode pad 32b, it is preferable to form the electrode pad 32b at a position with an enough distance from the low-profile optical elements 13, 43 for ensuring the necessary base area for the lens mold 34.

The lens mold 34 is provided with the lens element 36a for refracting light output from the low-profile optical element 13 and the lens element 36b for condensing light input from the outside formed thereon. Although the forming positions of the lens elements 36a, 36b are the position of the front face 34a above the low-profile optical elements 13, 43, respectively, these lens elements 36a, 36b can also be formed inside the lens mold 34. It should also be noted that similarly to the case with the first and the second embodiments, the height positions of the lens elements 36a, 36b need to be set within the Fraunhofer region where the geometrical-optical treatment of the light input/output by the low-profile optical elements 13, 43 is possible. Specifically, the height positions where the lens elements 36a, 36b are formed are required to set to positions (e.g., positions more than 100 through 200 μm distant from the active layers of the low-profile optical elements 13, 43, respectively) with at least a distance $L=D^2/\lambda$ from the active layers of the low-profile optical elements 13, 43, respectively.

It should be noted that as the lens elements 36a, 36b, for example, a Fresnel lens, a diffraction grating, or a refraction lens can be used. Further, a gradient-index lens formed by diffusing ions or the like inside the lens mold 34 to form gradient index in the lens mold 34 can be used therefor. Further, similarly to the case with the first embodiment, it is possible to add a coloring matter (a coloring agent) such as dye or pigment to the lens mold 34 to lower the transmission thereof to equal to or smaller than 50%.

As described above, according to the present embodiment, since there are provided the low-profile optical element 13 as the light emitting element and the low-profile optical element 43 as the light receiving element on the side of the front face 31a of the substrate 31, and further provided the drive circuit for driving the low-profile optical element 13 and the amplifier circuit of the electric signal photoelectrically converted by the low-profile optical element 43 in the circuit section of the electric circuit 32, a microminiature optical communication module having the light emitting element, the light receiving element, the drive circuit of the light emitting element, the amplifying circuit of the light receiving element, and the lens elements 36a, 36b for refracting the light input/output by the low-profile optical element integrated with each other can be realized.

Further, since the wiring pattern connecting the low-profile optical element 13 with the drive circuit and the wiring pattern connecting the low-profile optical element 43 with the amplifying circuit can be made extremely short, impedance mismatch or external noises can hardly affect thereto, thus a superior operation property can be expected. Further, by fairing the light output from the low-profile optical element 13 and the light input to the low-profile optical element 43 by the lens elements 36a, 36b, respectively, the advantages that the coupling efficiency with the light guide such as fiber optics can be enhanced, and that the tolerance of the position error at the coupling position with the light guide is enlarged can be obtained.

Fourth Embodiment

Figure 6:
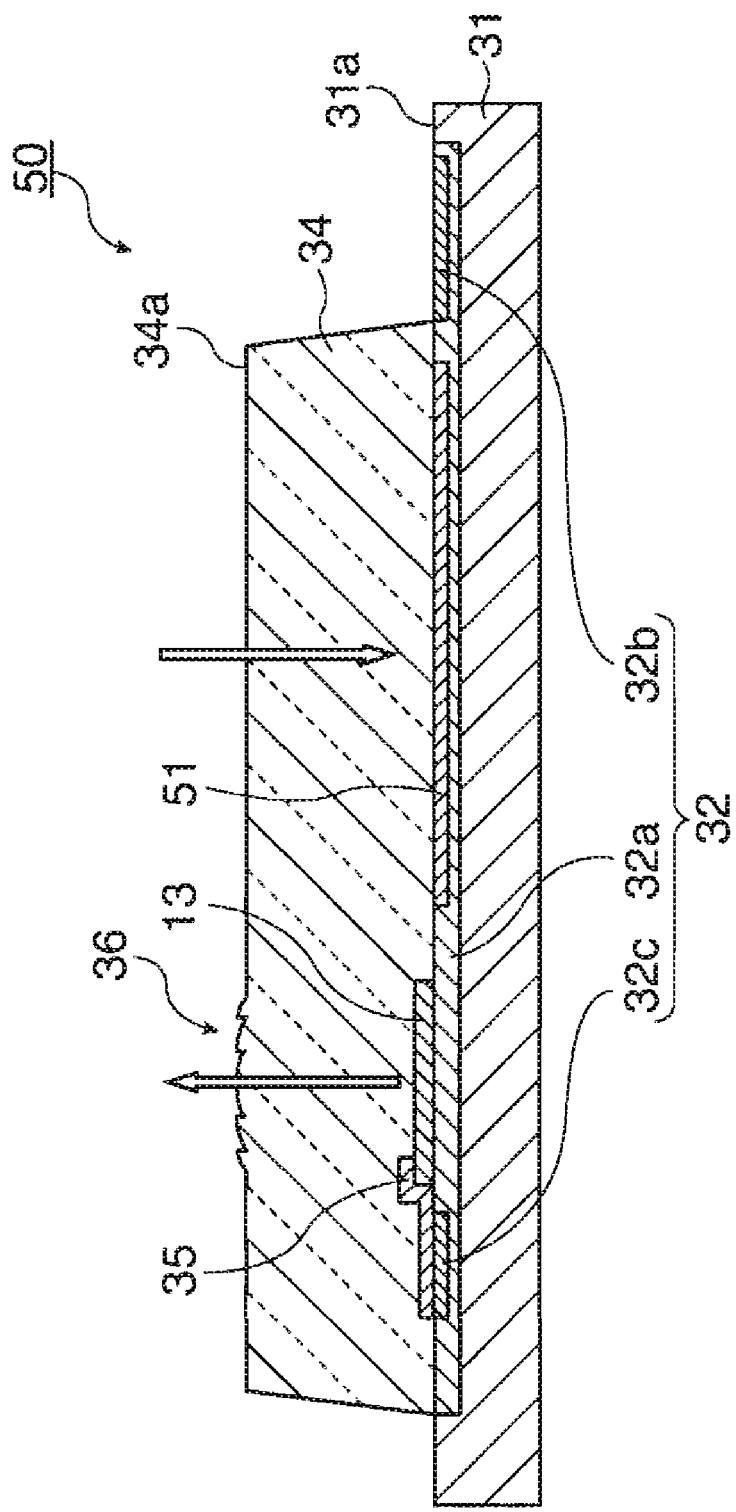
FIG. 6 is a cross-sectional view showing a substantial part of an optoelectric composite substrate according to a fourth embodiment of the invention.

FIG. 6 is a cross-sectional view showing a substantial part of the optoelectric composite substrate according to a fourth embodiment of the invention. It should be noted that the components corresponding to the components provided to the optoelectric composite substrate 10 according to the second embodiment explained using the FIG. 4 are denoted with the same reference numerals. Comparing an optoelectric composite substrate 50 of the present embodiment shown in FIG. 6 with the optoelectric composite substrate 30 of the second embodiment shown in FIG. 4, they are different from each other in that a light receiving section 51 for receiving light entering via the lens mold 34 is provided to the electric circuit 32 formed on the side of the front face 31a of the substrate 31. It should be noted that in the present embodiment, it is assumed that the low-profile optical element 13 is a light emitting element such as a VCSEL.

The light receiving section 51 is, for example, a photo diode. The reason why the light receiving section 51 is provided to the electric circuit 32 in the side of the front face 31a of the substrate 31 is for increasing the light-receiving area to improve the optical sensitivity. In other words, as is the case with the third embodiment, since there is a limit for enlarging the light-receiving area in the form of mounting the low-profile optical element 43 on the side of the front face 31a of the substrate 31, the light receiving section 51 is provided to the electric circuit 32 of the substrate 31. In this case, since a low-cost substrate is used as the substrate 31, enlargement of the substrate 31 does not largely increase the cost.

In the electric circuit 32 formed on the side of the front face 31a of the substrate 31, there are formed a drive circuit for driving the low-profile optical element 13 as the light emitting element and an amplifier circuit (amplifying circuit) for amplifying the electric signal photoelectrically converted by the light receiving section 51. It should be noted that although omitted in FIG. 6, the light receiving section 51 and the amplifier circuit are electrically connected to each other. Further, although in the third embodiment shown in FIG. 5; the lens elements 36a, 36b are formed respectively corresponding to the low-profile optical elements 13, 43, the lens element 36 is formed corresponding only to the low-profile optical element 13, and no lens element is formed corresponding to the light receiving section 51 in the present embodiment. This is because the light receiving area of the light receiving section 51 is large, and accordingly, there is no need for condensing the light entering the lens mold 34 from the outside.

It should be noted that, also in the present embodiment, the lens mold 34 is formed to cover the low-profile optical element 13, the light receiving section 51, and the metal wiring pattern 35, and also to cover almost entire surface of the electric circuit 32 formed on the substrate 11. Further, similarly to the second and third embodiments, it is not formed on the electrode pad 32b of the electric circuit 32, thus the upside of the electrode pad 32b remains open. Therefore, no problems occur in the electrical connection between the circuit section 32a provided to the electric circuit 32 and an external circuit (e.g., a power supply circuit). Since in the present embodiment, the light receiving section 51 is formed between the electrode pad 32b, which has no other choice than distantly disposed from the low-profile optical element 13, and the low-profile optical element 13, the space between the low-profile optical element 13 and the electrode pad 32*b* can effectively be utilized.

It should be noted that also in the present embodiment, as the lens element 36, for example, a Fresnel lens, a diffraction grating, or a refraction lens can be used. Further, a gradient-index lens formed by diffusing ions or the like inside the lens mold 34 to form gradient index in the lens mold 34 can be used therefor. Further, it is possible to add a coloring matter (a coloring agent) such as dye or pigment to the lens mold 34 to lower the transmission thereof to equal to or smaller than 50%.

Fifth Embodiment

Figure 7:
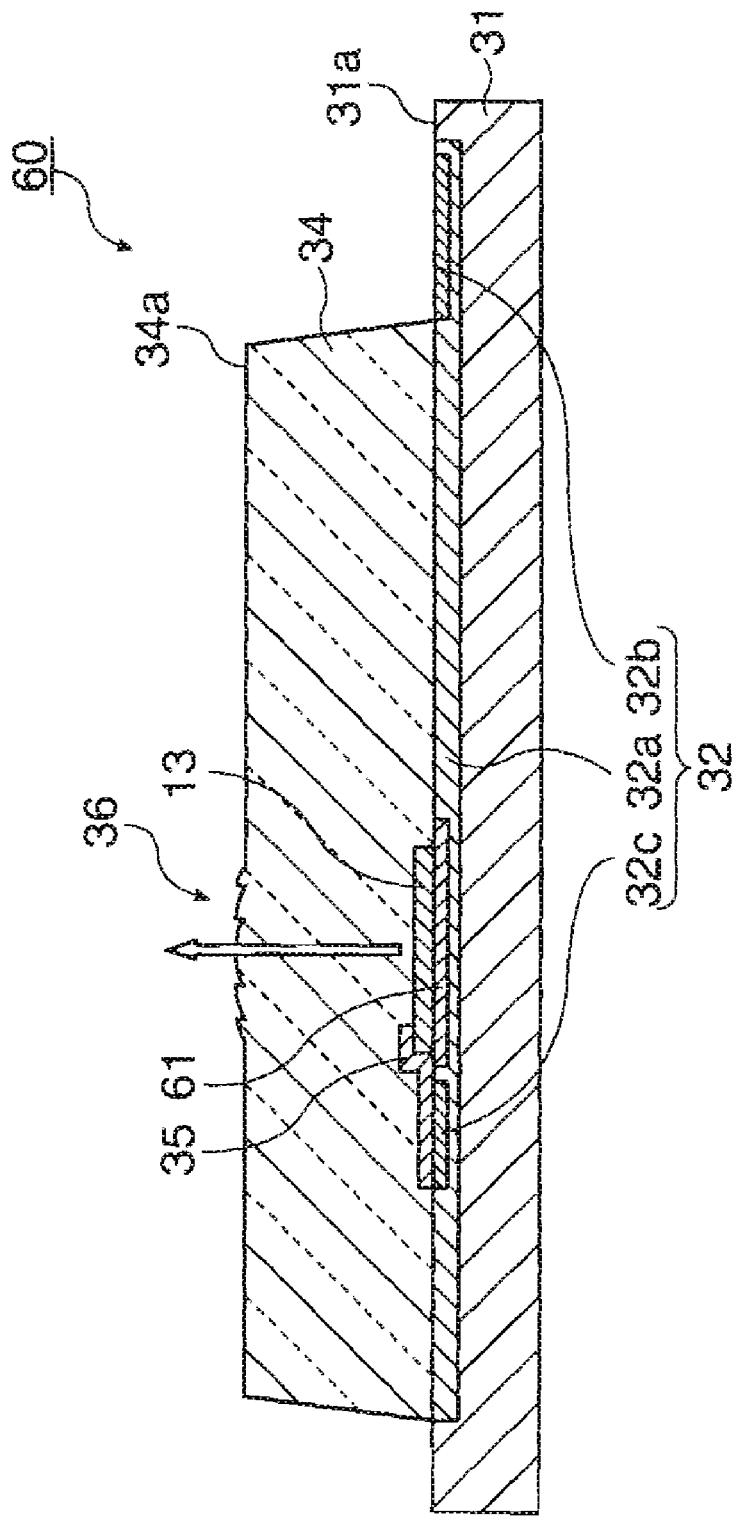
FIG. 7 is a cross-sectional view showing a substantial part of an optoelectric composite substrate according to a fifth embodiment of the invention.

FIG. 7 is a cross-sectional view showing a substantial part of the optoelectric composite substrate according to a fifth embodiment of the invention. It should be noted that the components corresponding to the components provided to the optoelectric composite substrate 30 according to the second embodiment explained using the FIG. 4 are denoted with the same reference numerals. Comparing an optoelectric composite substrate 60 of the present embodiment shown in FIG. 7 with the optoelectric composite substrate 30 of the second embodiment shown in FIG. 4, they are different from each other in that a detection element 61 is formed inside the electric circuit 39 formed on the side of the front face 31*a* of the substrate 31 and below the mounting position of the low-profile optical element 13. It should be noted that in the present embodiment, it is assumed that the low-profile optical element 13 is a light emitting element such as a VCSEL capable of outputting light from both of the front face and the rear face.

Figure 8:
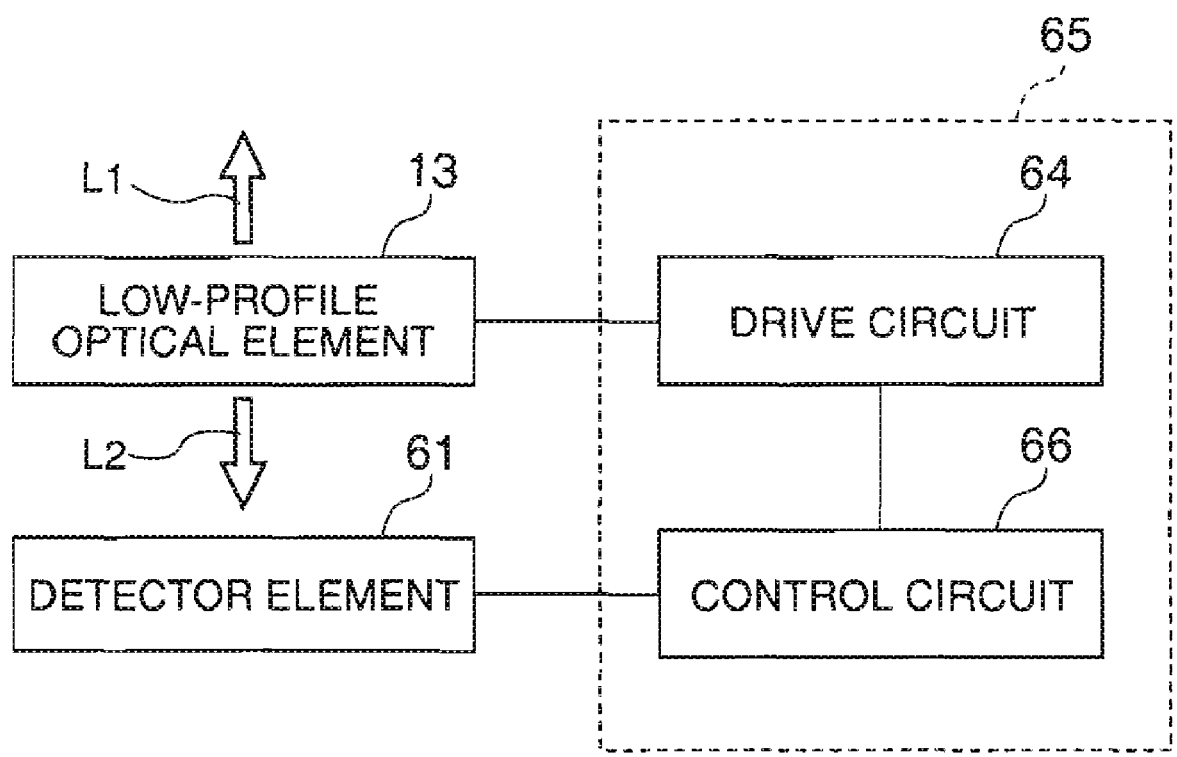
FIG. 8 is a block diagram showing a control section of a low-profile optical element 13.

The detection element 61 is a light receiving element such as a photo diode, and detects the light emitted from the rear face of the low-profile optical element 13 towards the substrate 31. FIG. 8 is a block diagram showing a control section of the low-profile optical element 13. It should be noted that in FIG. 8, it is assumed that the light output from the front face of the low-profile optical element 13 is defined as an upward output light L1, the light output from the rear face of the low-profile optical element 13 towards the substrate 31 is defined as a downward output light L2, and the detection element 61 detects the downward output light L2 output from the low-profile optical element 13.

As shown in FIG. 8, the control section 65 of the low-profile optical element 13 is configured including a drive circuit 64 for outputting drive current for driving the low-profile optical element 13, and a control circuit 66 for controlling the drive circuit 64 in accordance with the detection result of the detection element 61. It should be noted that as the control circuit 66, an automatic power control (APC) circuit for performing control so as to make the light output of the low-profile optical element 13 become constant can be cited. The control circuit 66 and the drive circuit 64 are provided to the circuit section 32*a* on the side of the front face 31*a* of the substrate 31.

In the above configuration, when a drive current is output from the drive circuit 64 to the low-profile optical element 13, the upward output light L1 and the downward output light L2 are output from the low-profile optical element 13. Since the output ratio between the upward output light L1 and the downward output light L2 has a constant value determined by the design of the low-profile optical element 13, the upward output light L1 can be known by monitoring the downward output light L2. The upward output light L1 is transmitted through the inside of the lens mold 34, refracted by the lens element 36 to be converted into, for example, parallel light, and output to the outside. In contrast, the downward output light L2 is received by the detection element 61 and is photoelectrically converted. The detection current proportional to the optical power of the downward output light L2 is output from the detection element 61, and the detection signal is input to the control circuit 66.

The control circuit 66 outputs the control signal in accordance with the detection current to the drive circuit 64. Then, the control circuit 66 compares the predetermined reference value set previously with the detection current output from the detection element 61, and generates the control signal so that the current becomes to have a desired constant value, namely the downward output light L2, namely the upward output light L1, output from the low-profile optical element 13 becomes to have a constant value. Then, the drive circuit 64 outputs the drive current in accordance with the control signal to the low-profile optical element 13. Thus, the upward output light L1 of the low-profile optical element 13 can be maintained to a desired constant value irrespective of the variation in the ambient temperature or time-course variation.

It should be noted that in the present embodiment, the case in which only the low-profile optical element 13 as a light emitting element is mounted on the substrate 31 is explained as an example. However, in the case in which both of the low-profile optical element 13 as the light emitting element and the low-profile optical element 43 as the light receiving element are mounted as in the third embodiment shown in FIG. 5, or in the case in which the low-profile optical element 13 as a light emitting element is mounted and the light receiving section 51 is provided to the substrate 31 as in the fourth embodiment shown in FIG. 6, the present embodiment can be applied. It should be noted that if the present embodiment is applied to the third or the fourth embodiment, it is necessary to dispose the detection element 61 on the side of the rear face of the low-profile optical element 13, and to provide the control section 65 of the low-profile optical element 13 to the circuit section 32*a*.

Low-Profile Optical Element

Hereinabove, the optoelectric composite substrate according to the embodiments of the invention is described. A method of manufacturing the low-profile optical elements 13, 43 mounted on the substrate 11, 31, and a method of mounting them on the substrate 11 and so on will now be explained. It should be noted that although in the following explanation the case in which the optoelectric composite substrate 10 according to the first embodiment of the invention shown in FIGS. 1 and 2 is manufactured by mounting the low-profile optical element 13 on the substrate 11 will be explained as an example, the mounting method described below can also be applied to the cases in which the optoelectric composite substrate 20 according to the modified example of the first embodiment, the optoelectric composite substrate 30, 40, 50, and 60 of the second through fifth embodiments are respectively manufactured.

Method of Manufacturing Low-Profile Optical Element
First Process

Figure 9:
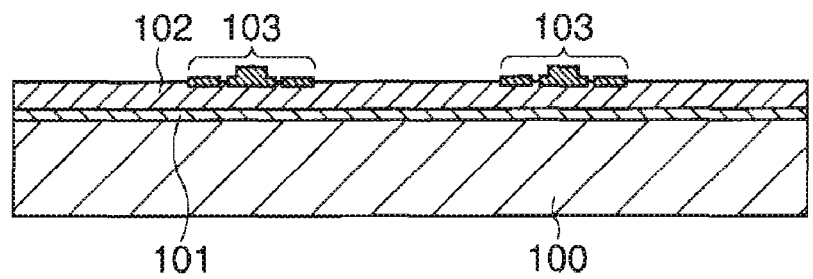
FIG. 9 is a cross-sectional view showing the first process of a manufacturing method of the low-profile optical element 13.

FIG. 9 is a cross-sectional view showing the first process of a manufacturing method of the low-profile optical element 13. In FIG. 9, the substrate 100 is a semiconductor substrate, which is, for example, a gallium arsenide compound semiconductor substrate. A sacrifice layer 101 is formed on the substrate 100. The sacrifice layer 101 is made of, for example, aluminum arsenide (AlAs), and has a thickness of about several hundreds nm. A functional layer 102 is formed on the sacrifice layer 101. The thickness of the functional layer is assumed to be, for example, about 1 through several tens μm.

Further, the element section 103 is created in the functional layer 102. The element formed in the element section 103 is, for example, a light emitting diode (LED), a surface emitting laser (VCSEL), or a photo diode (PD). These element sections 103 are each provided with an element by stacking multiple epitaxial layer on the substrate 100. Further, each of the element sections 103 is also provided with an electrode (an electrode of the low-profile optical element 13).

Second Process

Figure 10:
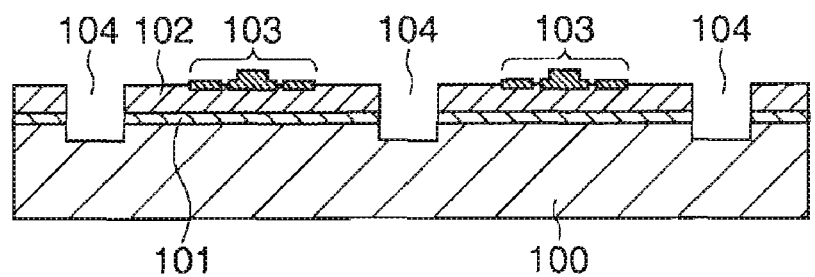
FIG. 10 is a cross-sectional view showing the second process of the manufacturing method of the low-profile optical element 13.

FIG. 10 is a cross-sectional view showing the second process of the manufacturing method of the low-profile optical element 13. As shown in FIG. 10, in the present process, separation grooves 104 are formed so as to separate each of the element sections 103. Each of these separation grooves 104 has a depth as deep as reaching at least the sacrifice layer 101. The width and the depth of each of the separation grooves 104 are, for example, in a range from ten to several hundreds μm. Further, the separation grooves 104 are made continuous to each other so that a selective etching liquid 106 (described in detail later) can flow in the separation grooves 104. Further, the separation grooves 104 are preferably formed in a reticular pattern.

Further, by arranging the distances between the separation grooves 104 to be in a range from several tens to several hundreds μm, the size of each element section 103 formed by separated by the separation grooves 104 is set to have the area of several tens through several hundreds μm square. The separation grooves 104 are formed by forming a resist by, for example, a photolithography technology with openings above the positions at which the separation grooves are to be formed, and etching the functional layer 102, the sacrifice layer 101, and further the substrate 100 using the resist as a mask by a wet etching method or a dry etching method. Alternatively, it is formed by forming U shaped grooves on the substrate 100 and so on by dicing in a range not causing a clack on the substrate 100.

Third Process

Figure 11:
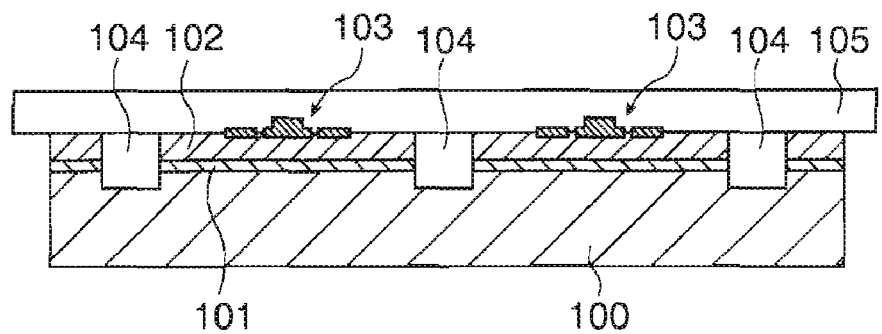
FIG. 11 is a cross-sectional view showing the third process of the manufacturing method of the low-profile optical element 13.

FIG. 11 is a cross-sectional view showing the third process of the manufacturing method of the low-profile optical element 13. In the present process, an intermediate transfer film 105 is adhered to the front face (the side of the element sections 103) of the substrate 100. The intermediate transfer film 105 is a flexible strip-shaped film coated with an adhesive on the surface thereof.

Fourth Process

Figure 12:
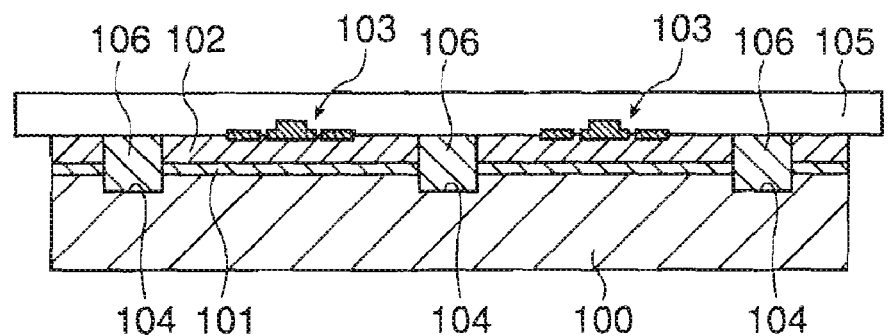
FIG. 12 is a cross-sectional view showing the fourth process of the manufacturing method of the low-profile optical element 13.

FIG. 12 is a cross-sectional view showing the fourth process of the manufacturing method of the low-profile optical element 13. In the present process, the selective etching liquid 106 is injected in the separation grooves 104. In the present process, low concentration hydrochloric acid having high selectivity against aluminum arsenide is used as the selective etching liquid 106 for selectively etching only the sacrifice layer 101. By injecting the selective etching liquid 106 in the separation grooves 104, the sacrifice layer 101 is etched selectively. Further, by injecting the selective etching liquid 106 in the separation grooves 104 for a predetermined period of time, the entire sacrifice layer 101 is removed from the substrate 100.

Fifth Process

Figure 13:
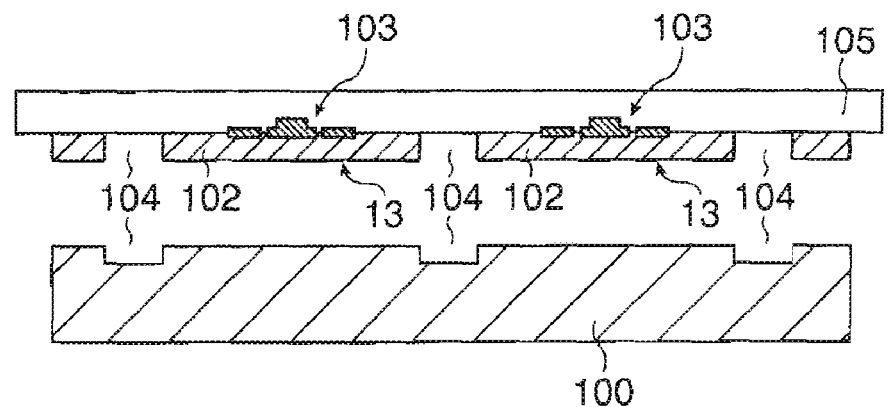
FIG. 13 is a cross-sectional view showing the fifth process of the manufacturing method of the low-profile optical element 13.

FIG. 13 is a cross-sectional view showing the fifth process of the manufacturing method of the low-profile optical element 13. When the entire sacrifice layer 101 is etched in the fourth process, the functional layers 102 are separated from the substrate 100. Then, in the present process, by detaching the intermediate transfer film 105 from the substrate 100, the functional layers 102 adhered to the intermediate transfer film 105 are detached from the substrate 100. Thus the functional layers 102 each provided with the element section 103 are separated by forming the separation grooves 104 and etching the sacrifice layer 101 to form the low-profile optical elements 13 described above, and adhered to and held by the intermediate transfer film 105. It should be noted here that the functional layer 102 preferably has a thickness of for example, about 1 through 10 μm and a size (each of horizontal and vertical) of, for example, several tens through several hundreds μm. The low-profile optical element 13 is manufactured through the first through the fifth processes described above.

Hereinafter, a method of mounting the low-profile optical element 13 on the substrate 11 will be explained.

Method of Mounting Low-Profile Optical Element

First Process

Figure 14:
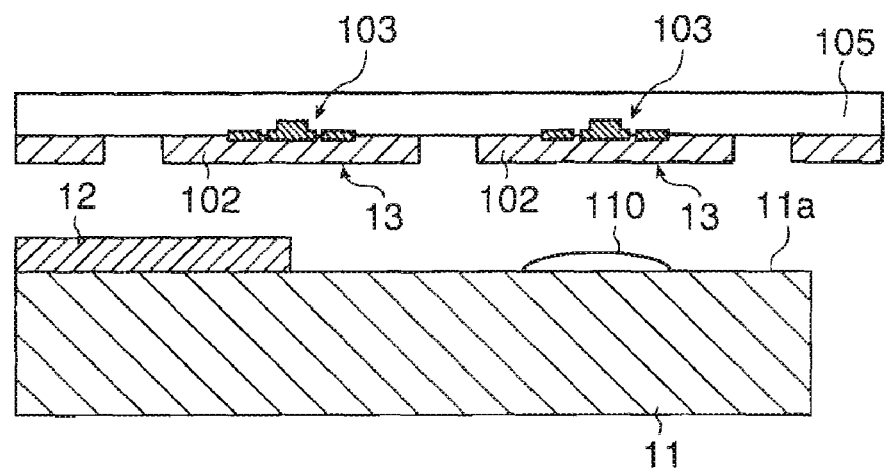
FIG. 14 is a cross-sectional view showing the first process of a mounting method of the low-profile optical element 13.

FIG. 14 is a cross-sectional view showing the first process of a mounting method of the low-profile optical element 13. In the present process, the low-profile optical element 13 is aligned at a desired position on the substrate 11 by moving the intermediate transfer film 105 to which the low-profile optical element 13 is adhered. It should be noted that the position on the front face 11a of the substrate 11 at which the low-profile optical element 13 is to be mounted is previously coated with an adhesive 110 for adhering the low-profile optical element 13. Further, the printed wiring pattern 12 is formed on the front face 11a at a desired position.

Second Process

Figure 15:
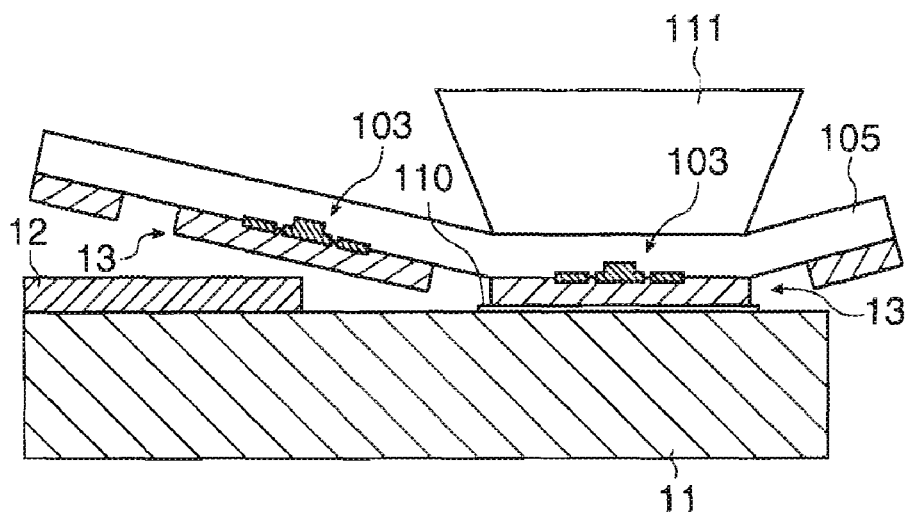
FIG. 15 is a cross-sectional view showing the second process of the mounting method of the low-profile optical element 13.

FIG. 15 is a cross-sectional view showing the second process of the mounting method of the low-profile optical element 13. In the present process, the low-profile optical element 13 aligned above the position on the substrate 11 at which the low-profile optical element 13 is to be mounted is pressed against the substrate 11 by a back pushing pin 111 via the intermediate transfer film 105 to be bonded with the substrate 11. In this case, since the position on which the low-profile optical element 13 is to be mounted is coated with the adhesive 110, the low-profile optical element 13 is bonded to the position on which the low-profile optical element 13 is to be mounted.

Third Process

Figure 16:
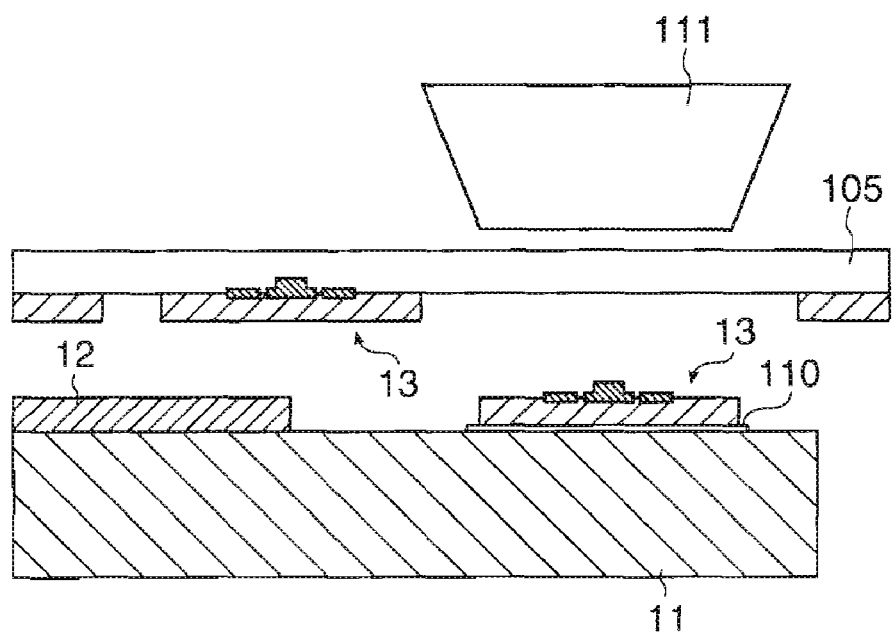
FIG. 16 is a cross-sectional view showing the third process of the mounting method of the low-profile optical element 13.

FIG. 16 is a cross-sectional view showing the third process of the mounting method of the low-profile optical element 13. In the present process, the adhesion of the intermediate transfer film 105 is dissolved to detach the intermediate transfer film from the low-profile optical element 13. The adhesive of the intermediate transfer film 105 is arranged to lose its adhesion by ultraviolet (UV) irradiation or heat irradiation. In the case in which the UV curing adhesive is used, the back pushing pin 111 has previously been made of a transparent material, and the ultraviolet (UV) beam is irradiated from the tip of the back pushing pin 111, thus dissolving the adhesion of the intermediate transfer film 105. In the case in which the thermoset adhesive is used, it is sufficient to heat the back pushing pin 111.

Alternatively, it is possible that the entire intermediate transfer film 105 is irradiated with the ultraviolet beam after the first process to dissolve the adhesion in the entire intermediate transfer film 105. Since slight adhesiveness remains even after dissolving the adhesion, the low-profile optical element 13, which is very thin and light weight, can be still held by the intermediate transfer film 105. Through the above processes, the low-profile optical element 13 is mounted on the substrate 11.

Accordingly, the functional layer of the optical element made of a very thin film manufactured on the source substrate is separated from the source substrate as a unit having the necessary minimum area considering the connection of the electrode and so on, and the functional layer is transferred to the host substrate, and then lens mold is formed on the host substrate so that the low-profile optical element is embedded therein. According to the above processes, the expensive optical element can be made with the necessary minimum area to sufficiently increase the number of the optical elements taken from the source substrate, thus avoiding elevation of the cost. Further, by selecting the substrates having a signal processing function or freedom of applications such as an IC or a flexible wiring board as the host substrate, a higher added value can be obtained than what is obtained by simply combining the optical element with the lens mold.

Lens Mold

Hereinafter, a method of forming the lens mold 14 on the low-profile optical element 13 will be explained using FIGS. 17A through 17C, and 18A through 18C. It should be noted that although in the following explanation the case in which the optoelectric composite substrate 10 according to the first embodiment of the invention shown in FIGS. 1 and 2 is manufactured by mounting the low-profile optical element 13 on the substrate 11 will be explained as an example, the mounting method described below can also be applied to the cases in which the optoelectric composite substrate 20 according to the modified example of the first embodiment, the optoelectric composite substrate 30, 40, 50, and 60 of the second through fifth embodiments are respectively manufactured.

Lens Mold Forming Method

First Process

Figure 17A:
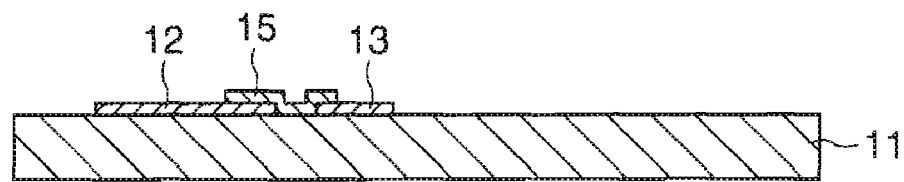
FIGS. 17A through 17C are cross-sectional views showing a forming method of a lens mold 14.

FIG. 17A is a cross-sectional view of a condition in which the lens mold 14 is not formed on the substrate 11. After mounting the low-profile optical element 13 on the substrate 11, the printed wiring pattern 12 and the electrode of the low-profile optical element 13 are electrically connected to each other with the metal wiring pattern 15. It should be noted here that as the metal wiring pattern 15, either one of a metallic ink wiring pattern, a metallic paste wiring pattern, a metallic coating wiring pattern, and a metallic sputter wiring pattern, for example, can be used. In particular, formation of the metal wiring pattern 15 with the metallic ink wiring pattern allows the formation of the wiring pattern with high productivity and low cost.

A glass mask 62 with a relief, provided with a light blocking section, a light transmission section, and a optical element pattern is provided. On the surface of the glass mask 62 with the relief, there is curved a relief 62a forming a relief pattern for forming the lens shape on the upper surface of the lens mold 14. The relief 62a forms a pattern of the optical element. A photolithography process, a laser process and so on can be used for forming the relief 62a. Further, the surface of the glass mask is provided with a light blocking mask 62b, thus the ultraviolet beam can be transmitted only to the desired portion of the lens mold forming section. The portion without the light blocking mask 62b becomes the light transmission section. The surface of the glass mask 62 with the relief is preferably processed with a fluoride treatment for enhancing the exfoliative property to the ultraviolet curing resin 63. As the fluoride treatment, a monomolecular film made of fluoroalkylsilane can be used. In this case, the wavelength of the ultraviolet beam is preferably in a range from 250 to 4-50 nm with which the ultraviolet resin 63 can be cured without degrading the fluoroalkylsilane.

Figure 17B:
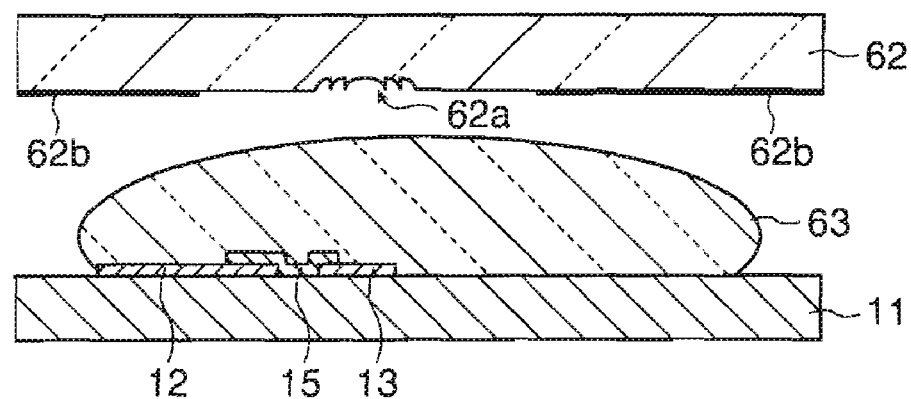
Figure 17C:
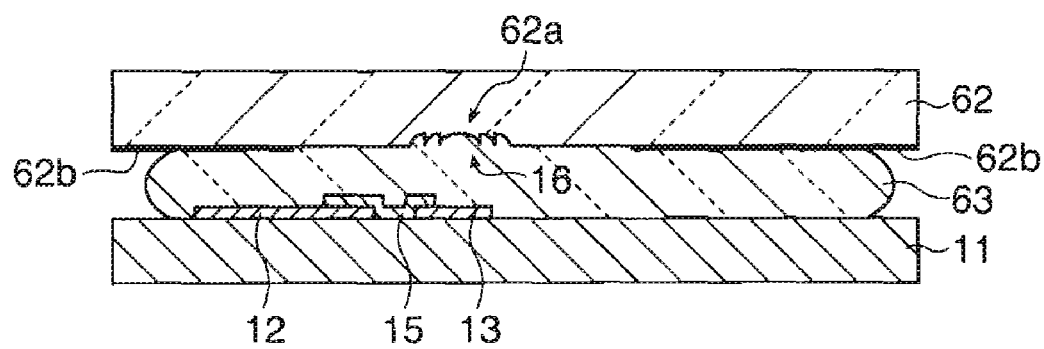

After the glass mask 62 with the relief has been prepared, the front face of the substrate 11 is coated with the ultraviolet curing resin 63, which is a material of the lens mold 14, as shown in FIG. 17B. The ultraviolet curing resin 63 can be selected from various materials such as acrylic resin or epoxy resin in accordance with the characteristics. Further, besides the ultraviolet curing resin 63, photosensitive sol-gel can be used.

Subsequently, as shown in FIG. 11C, the glass mask 62 with the relief is brought into contact with the ultraviolet curing resin 63 to be aligned with the substrate 11. The alignment is performed to bring the optical axis of the low-profile optical element 13 and the center of the relief 62a in line. In the case in which the low-profile optical element 13 is a VCSEL, since the optical axis of the emitted laser beam is perpendicular to the substrate, the alignment is performed so that the center of the relief 62a and the laser-emitting section of the low-profile optical element 13 overlap each other in a sight from a viewpoint right above the substrate 11. It is possible to shift the two optical axes from each other on purpose. In this case, it is possible to tilt the optical axis of the laser beam emitted from the low-profile optical element 13 and transmitted through the ultraviolet curing resin 63.

The height of the lens mold 14 is determined in accordance with the distance between the glass mask 62 with the relief and the substrate 11 in the alignment process. In order for obtaining the desired lens function inherent in the lens mold 14, it is required to precisely control the height of the lens mold 14, namely the distance between the glass mask 62 with the relief and the substrate 11. For example, in order for obtaining a collimated light beam, it is required to adjust the height of the glass mask 62 with the relief from the substrate 11 so that the focus of the lens element 16 and the emitting surface of the low-profile optical element 13 match with each other.

It is advisable that they are brought into contact with each other under reduced pressure so as not to cause any bubbles in the boundary face between the ultraviolet curing resin 63 and the glass mask 62 with the relief.

Figure 18A:
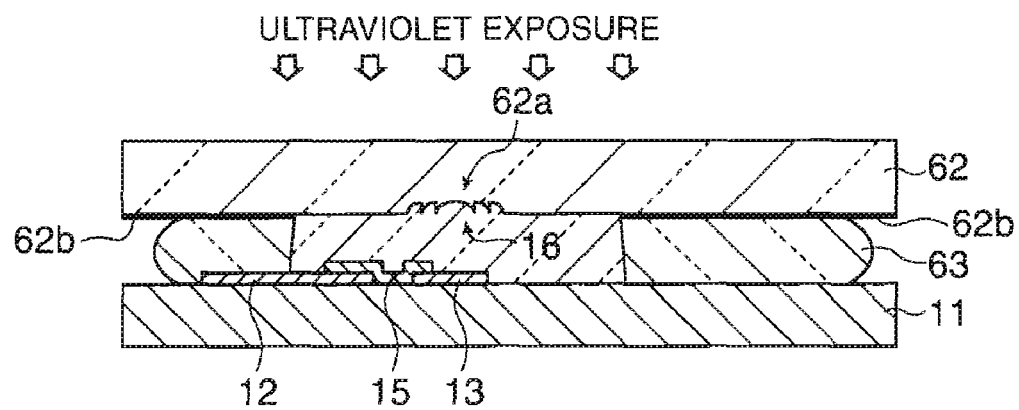
FIGS. 18A through 18C are cross-sectional views showing another forming method of the lens mold 14.

Subsequently, as shown in FIG. 18A, the ultraviolet beam is irradiated from the upper surface of the glass mask 62 with the relief. Thus, the lens mold section 14, which is a part of the ultraviolet curing resin 63 positioned between the glass mask 62 with the relief and the substrate 11, and not blocked by the light blocking mask 62b, is cured.

Figure 18B:
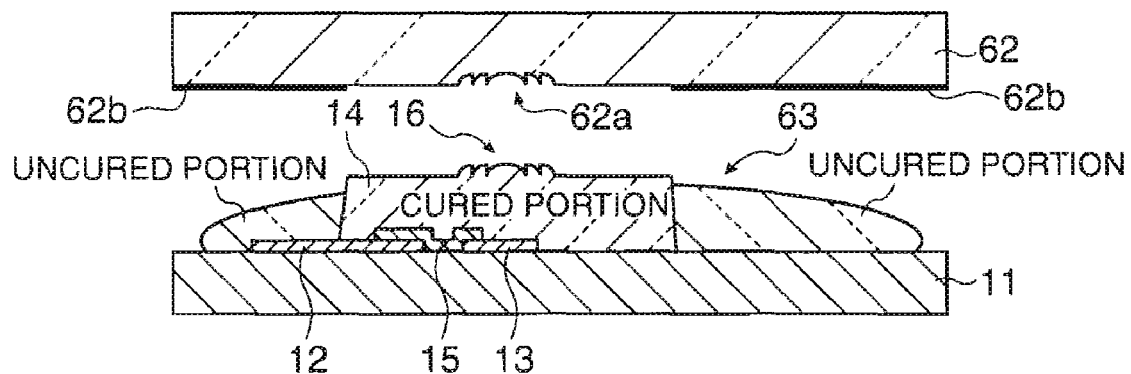

Subsequently, as shown in FIG. 18B, the glass mask 62 with the relief is exfoliated from the substrate 11. Since the surface of the glass mask 62 with the relief is provided with an enhanced exfoliative property by the fluoride treatment, the cured lens mold 14 is exfoliated in the side of the grass mask 62 with the relief and remains on the side of the substrate 11.

Figure 18C:
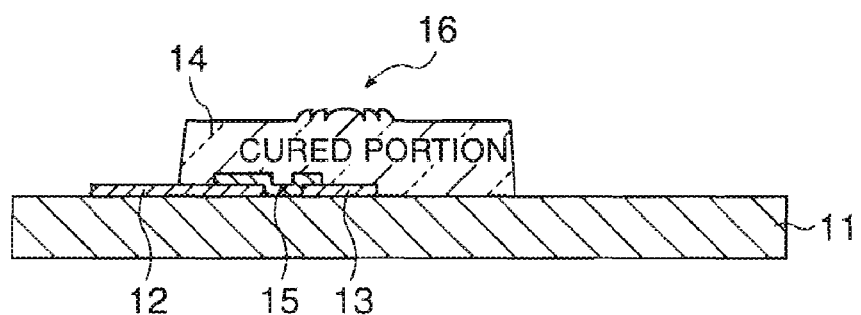

Finally, as shown in FIG. 18C, the uncured ultraviolet curing resin 63, which has not been exposed to the ultraviolet beam is rinsed away with an organic solvent. According to the above processes, the lens mold 14 provided with the lens element 16 on the upper surface thereof, and with the low-profile optical element 13 embedded therein is formed.

As described above, by integrally molding the lens mold 14 provided with the lens element 16 including a lens surface on the front face of the low-profile optical element 13 such as the surface emitting laser element, a well-shaped laser beam can be obtained from a single element without using an external optical component. Accordingly, individual optical components and the trouble of assembling and adjusting the individual optical components can be eliminated, thus dramatic reduction of cost can be expected. Further, enormous downsizing also becomes possible.

Further, in order for performing beam shaping on the light bean emitted from the miniature emitting surface with a finite size D such as a surface emitting laser (VCSEL), the lens surface can easily be disposed in the Fraunhofer region ($>D^2/\mu$) of the emitting surface (an active layer) of the low-profile optical element 13. In addition, although in general optical elements can easily be deteriorated by environmental factors such as moisture or oxygen, the low-profile optical element is protected by completely embedded in the lens mold in the present embodiments of the invention, thus offering improved reliability.

Electronic Apparatus

Figure 19A:
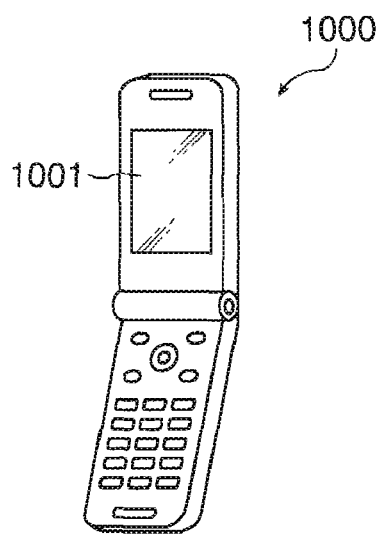
FIGS. 19A through 19C are perspective views showing examples of an electronic apparatus according to the invention.
Figure 19B:
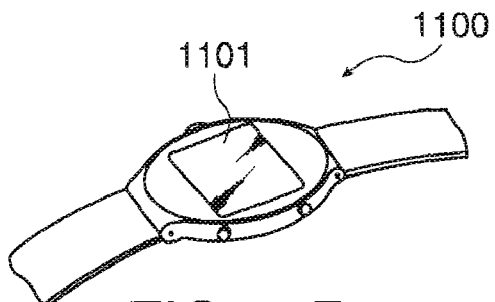
Figure 19C:
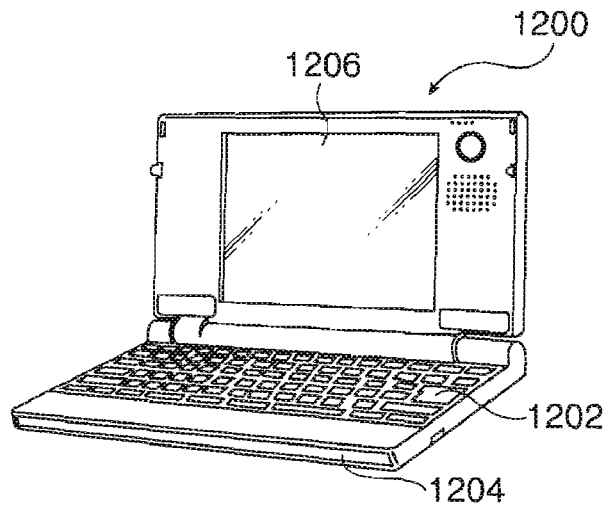

An electronic apparatus according to an embodiment of the invention will hereinafter be described. The electronic apparatus according to an embodiment, of the invention is provided with the optoelectric composite substrate described above, and those illustrated in FIGS. 19A through 19C can be cited as specific examples. FIGS. 19A through 19C are schematic views showing examples of an electronic apparatus according to the invention. FIG. 19A is a perspective view showing an example of a cellular phone. In FIG. 19A, the cellular phone 1000 is provided with either one of the optoelectric composite substrates described above. The optoelectric composite substrate of the cellular phone 1000 is provided for, for example, transmitting display data from a CPU to a display section 1001.

FIG. 19B is a perspective view showing an example of a wrist watch type of electronic apparatus. In FIG. 19B, the watch 1100 is provided with either one of the optoelectric composite substrates described above. Also in the watch 1100, the optoelectric composite substrate is provided for transmitting display data to a display section 1101. FIG. 19C is a perspective view showing an example of a portable data processing device such as a word processor or a personal computer. In FIG. 19C, the information processing device 1200 is provided with a input section 1202 such as a keyboard, a display section 1206 to which the display data is transmitted by either one of the optoelectric composite substrates described above, and an information processing device body (a housing) 1204. Since the electronic apparatuses shown in FIGS. 19A through 19C are provided with display sections 1001, 1101, 1206, respectively, to which display data is transmitted from either one of the optoelectric composite substrates described above, the electronic apparatuses having preferable display characteristics can be provided.

It should be noted that the optoelectric composite substrates according to the present embodiment can be applied to various electronic apparatuses including a portable information terminal such as a viewer or a game console, an electronic book, or an electronic paper beside the electronic apparatuses described above. Further, either of the optoelectric composite substrates can also be applied to various electronic apparatuses such as a video camera, a digital camera, a car navigation system, a car stereo system, a drive operation panel, a personal computer, a printer, a scanner, a television set, a video player. Moreover, they can be applied to a displacement sensor, a pressure sensor, a vibration sensor, a tilt sensor, a light absorption sensor, a gas sensor, or a particle sensor applying a linear encoder or a rotary encoder for detecting change of a position or change of optical characteristics of an object by irradiating the object with a laser beam and detecting the reflected light. Still further, they can also be applied to an optical communication module (a transmission module, a receiving module) for optical communications.

The entire disclosure of Japanese Patent Application Nos: 2006-043481, filed Feb. 21, 2006 and 2006-256861, filed Sep. 22, 2006 are expressly incorporated by reference herein.

What is claimed is:

1. An optoelectric composite substrate, comprising:
  a substrate including a first portion, a second portion and a third portion, the second portion being positioned between the first portion and third portion;
  a wiring pattern formed on the first portion of the substrate;
  an optical element formed on the third portion of the substrate;
  a conductive film formed on the wiring pattern, the second portion of the substrate, and the optical element, the conductive film electrically connecting the wiring pattern and the optical element; and
  a lens mold formed on a portion of the wiring pattern, the optical element, and the conductive film, the lens mold including a lens element formed in a position overlapping the optical element.

2. The optoelectric composite substrate according to claim 1, the conductive film being a metallic coating wiring pattern.

3. The optoelectric composite substrate according to claim 1, the conductive film being a metallic sputter wiring pattern.

4. The optoelectric composite substrate according to claim 1, a thickness of the optical element being 10 μm.

5. The optoelectric composite substrate according to claim 1, further comprising:
  an insulating film formed between the optical element and the lens mold.

6. The optoelectric composite substrate according to claim 1, the optical element being a light emitting element.

7. The optoelectric composite substrate according to claim 6, the lens element being positioned within a Fraunhofer region of a light emitted by the light emitting element, the Fraunhofer region being defined as a region that is apart from the light emitting element by a distance that is equal to or greater than $L=D^2/\lambda$, D being a diameter of a near field pattern of the light emitted from the light emitting element, and $\lambda$ being a wavelength of the light.

8. The optoelectric composite substrate according to claim 1, the optical element being a VCSEL.

9. An optoelectric composite substrate, comprising:
  a substrate including a first area and a second area, the first area including a first portion, a second portion and a third portion, the second portion being positioned between the first portion and the third portion;
  a light emitting element formed on the first portion of the first area of the substrate;
  a first electrode formed on the third portion of the first area of the substrate; a first conductive film formed on the first electrode, the second portion of the first area of the substrate, and the light emitting element, the first conductive film electrically connecting the light emitting element and the electrode; and
  a lens mold formed above the second area of the substrate, the lens mold including a lens element formed in a position overlapping the light emitting element.

10. The optoelectric composite substrate according to claim 9, the first conductive film being a metallic ink wiring pattern.

11. The optoelectric composite substrate according to the claim 9, further comprising:
  an electric circuit provided with the substrate, the electric circuit being electrically connected to the first electrode.

12. The optoelectric composite substrate according to claim 9, further comprising:
  an electrode pad formed on the second area of the substrate.

13. The optoelectric composite substrate according to claim 9, the electric circuit including a driving circuit that drives the light emitting element.

14. The optoelectric composite substrate according to claim 9, the second area including a third portion, a fourth portion and a fifth portion, the fourth portion being positioned between the third portion and the fifth portion, further comprising:
- a light receiving element formed on the third portion of the second area of the substrate;
- a second electrode formed on the fifth portion of the second area of the substrate;
- a second conductive film formed on the light receiving element, the fourth portion of the second area of the substrate, and the second electrode, the second conductive film electrically connecting the second electrode and the light receiving element; and
- another lens element formed in the lens mold in a position overlapping the light receiving element.

15. The optoelectric composite substrate according to claim 9, the lens element including a Fresnel lens.

16. The optoelectric composite substrate according to claim 9, the lens mold including a coloring material.

17. An optoelectric composite substrate, comprising:
- a substrate;
- a wiring pattern formed on a portion of the substrate;
- an optical element formed on another portion of the substrate;
- a conductive film formed over a portion of the wiring pattern and a portion of the optical element, the conductive film electrically connecting the wiring pattern and the optical element;
- a lens mold formed on a portion of the wiring pattern, the optical element, and the conductive film, the lens mold including a lens element formed in a position overlapping the optical element; and
- an insulating film formed between the optical element and the lens mold.

18. The optoelectric composite substrate according to claim 16, the lens element including a gradient index lens.

19. The optoelectric composite substrate according to claim 16, the lens element including resin.

20. The optoelectric composite substrate according to claim 1, a thickness of the optical element being 10 μm.

21. An electronic apparatus composing the optoelectric composite substrate according to claim 1.

* * * * *